(12) United States Patent
Tanaka

(10) Patent No.: US 11,073,392 B2
(45) Date of Patent: *Jul. 27, 2021

(54) PHYSICAL QUANTITY SENSOR, COMPLEX SENSOR, INERTIAL MEASUREMENT UNIT, PORTABLE ELECTRONIC DEVICE, ELECTRONIC DEVICE, AND VEHICLE

(71) Applicant: Seiko Epson Corporation, Tokyo (JP)

(72) Inventor: Satoru Tanaka, Chino (JP)

(73) Assignee: Seiko Epson Corporation

( * ) Notice: Subject to any disclaimer, the term of this patent is extended or adjusted under 35 U.S.C. 154(b) by 290 days.

This patent is subject to a terminal disclaimer.

(21) Appl. No.: 16/115,939

(22) Filed: Aug. 29, 2018

(65) Prior Publication Data

US 2019/0063924 A1 Feb. 28, 2019

(30) Foreign Application Priority Data

Aug. 30, 2017 (JP) .............................. JP2017-165186

(51) Int. Cl.
*G01C 19/5769* (2012.01)
*G01P 15/125* (2006.01)
(Continued)

(52) U.S. Cl.
CPC ........ *G01C 19/5769* (2013.01); *B81B 7/0016* (2013.01); *G01P 15/125* (2013.01);
(Continued)

(58) Field of Classification Search
CPC ............ G01C 19/5769; G01C 19/5656; G01C 19/5663; G01C 19/5719; G01P 15/125;
(Continued)

(56) References Cited

U.S. PATENT DOCUMENTS

| 9,316,666 B2 | 4/2016 | Suzuki | |
|---|---|---|---|
| 2004/0025591 A1* | 2/2004 | Yoshikawa | ............. G01P 15/18 73/514.32 |

(Continued)

FOREIGN PATENT DOCUMENTS

| JP | 2004-093226 A | 3/2004 |
|---|---|---|
| JP | 2007-298405 A | 11/2007 |

(Continued)

OTHER PUBLICATIONS

Yukihisa Yoshida et al., "Development of Deep Reactive Ion Etching (DEEP-RIE) Process for Bonded Silicon-Glass Structures", T. IEE Japan, vol. 122-E, No. 8, 2002, pp. 391-397, with English translation.

*Primary Examiner* — Nimeshkumar D Patel
*Assistant Examiner* — Gedeon M Kidanu
(74) *Attorney, Agent, or Firm* — Harness, Dickey & Pierce, P.L.C.

(57) ABSTRACT

A physical quantity sensor includes: a movable body that includes a beam, a coupling portion that is connected with the beam and is provided in a direction intersecting with the beam, and a first and second mass portions that are connected with the coupling portion at connection positions; a first and second fixed electrodes are opposed to the first and second mass portions; and a protrusion are provided and protrude toward the first and second mass portions. In the intersecting direction, in a case where a distance from connection positions to end portions of the first and second mass portions opposite to the beam is L, and a distance from the protrusions to end portions of the first and second mass portions opposite to the beam is L1, the distance L1 is 0.5 L or longer and 3.1 L or shorter.

19 Claims, 20 Drawing Sheets

(51) Int. Cl.
 _B81B 7/00_ (2006.01)
 _G01P 15/08_ (2006.01)

(52) U.S. Cl.
 CPC ............... *B81B 2201/0235* (2013.01); *G01P 2015/0831* (2013.01); *G01P 2015/0871* (2013.01)

(58) Field of Classification Search
 CPC ..... G01P 2015/0871; G01P 2015/0831; G01P 15/18; G01P 1/00; G01P 1/006; G01P 2015/0814; G01P 2015/0874; B81B 7/0016; B81B 2201/0235; B81B 3/0008; B81B 2201/018; B81B 2201/0242; B81B 2203/0118; B81B 2203/04; B81B 2203/058; B81B 2207/012; B81B 3/0016; B81B 3/0072; B81B 3/0097; B81B 7/0048; B81C 2203/0109; H01G 5/16; H01H 1/0036; H01H 59/0009
 See application file for complete search history.

(56) References Cited

U.S. PATENT DOCUMENTS

| | | |
|---|---|---|
| 2004/0079154 A1 | 4/2004 | Yoshikawa et al. |
| 2005/0268719 A1 | 12/2005 | Malametz |
| 2010/0024553 A1 | 2/2010 | Classen et al. |
| 2010/0281980 A1 | 11/2010 | Yazawa et al. |
| 2012/0186346 A1 | 7/2012 | McNeil et al. |
| 2014/0183014 A1* | 7/2014 | Inoue ..................... H01G 5/16 200/181 |
| 2014/0230546 A1 | 8/2014 | Allegato et al. |
| 2014/0298909 A1* | 10/2014 | Simoni ................. B81B 7/0048 73/514.32 |
| 2014/0338450 A1 | 11/2014 | Classen |
| 2014/0338451 A1* | 11/2014 | Takagi ................. B81B 3/0008 73/514.32 |
| 2015/0020591 A1 | 1/2015 | Tanaka |
| 2015/0241466 A1* | 8/2015 | Tanaka ................. G01P 15/125 73/514.32 |
| 2016/0047839 A1 | 2/2016 | Tanaka |
| 2016/0054353 A1 | 2/2016 | Tanaka |
| 2017/0023606 A1 | 1/2017 | Naumann |
| 2017/0074658 A1 | 3/2017 | Tanaka |
| 2017/0088413 A1 | 3/2017 | Tanaka |
| 2017/0089945 A1 | 3/2017 | Naumann |
| 2017/0129769 A1 | 5/2017 | Geisberger |

FOREIGN PATENT DOCUMENTS

| | | |
|---|---|---|
| JP | 2009-537803 | 10/2009 |
| JP | 2014-224739 A | 12/2014 |
| JP | 5700652 B2 | 4/2015 |
| JP | 2017-067540 A | 4/2017 |
| WO | WO-03-044539 A1 | 5/2003 |
| WO | WO-2007-131835 A1 | 11/2007 |
| WO | WO-2009-099125 A1 | 8/2009 |

\* cited by examiner

PHYSICAL QUANTITY SENSOR, COMPLEX SENSOR, INERTIAL MEASUREMENT UNIT, PORTABLE ELECTRONIC DEVICE, ELECTRONIC DEVICE, AND VEHICLE

BACKGROUND

1. Technical Field

The present invention relates to a physical quantity sensor, a complex sensor, an inertial measurement unit, a portable electronic device, an electronic device, and a vehicle.

2. Related Art

In recent years, as a method of measuring an acceleration as physical quantity, a physical quantity sensor that is configured according to a rocker lever principle and measures the acceleration from electrostatic capacitance that changes according to the acceleration applied in a vertical direction is known. For example, in WO03/044539A1, an acceleration sensor (physical quantity sensor) that has a first fixed electrode and a second fixed electrode provided on a glass substrate, and a movable electrode symmetrically disposed with respect to a center line of a torsion beam formed of a silicon substrate, in which one side of the movable electrode is disposed opposite to the first fixed electrode, and the other side thereof is disposed opposite to the second fixed electrode is disclosed. In the acceleration sensor described in WO03/044539A1, a protrusion that prevents an end portion of the movable electrode from coming into contact with the substrate is provided.

In "Development of Deep Reactive Ion Etching (Deep-RIE) Process for Bonded Silicon-Glass Structures" T.IEE Japan, Vol. 122-E (2002) No. 8, pages 391 to 397, process damages in the bonded silicon glass structures and its solution direction are discussed. When performing through-etching on a silicon substrate to which a rear surface of a silicon substrate and a glass substrate are bonded, etching gas wraps around a gap between the rear surface of the silicon substrate and the glass substrate from a penetrating opening. As a result, the glass substrate is charged up, the etching gas recoiled by the repulsive force erodes the rear surface of the silicon substrate, and damages the structures. The damaged structures break easily. It is disclosed that the damage is suppressed by forming a conductive film that connects the silicon substrate on the glass substrate.

However, the method of suppressing damages on the rear surface of the silicon substrate disclosed in "Development of Deep Reactive Ion Etching (Deep-RIE) Process for Bonded Silicon-Glass Structures" T.IEE Japan, Vol. 122-E (2002) No. 8, pages 391 to 397 was not applicable to the physical quantity sensor disclosed in WO03/044539A1. The physical quantity sensor disclosed in WO03/044539A1 measures the acceleration by the electrostatic capacitance generated between the first fixed electrode formed on the glass substrate and a first mass portion formed on the silicon substrate (one side of movable electrode) and between the second fixed electrode and a second mass portion (the other side of movable electrode). That is, it is not possible to connect the conductive film (first and second fixed electrodes) provided on the glass substrate and the silicon substrate (first and second mass portions) as is described in "Development of Deep Reactive Ion Etching (Deep-RIE) Process for Bonded Silicon-Glass Structures" T.IEE Japan, Vol. 122-E (2002) No. 8, pages 391 to 397. Therefore, in the physical quantity sensor in WO03/044539A1, there was a risk of the structure being easily broken due to the damage received on the rear surface of the silicon substrate.

SUMMARY

An advantage of some aspects of the invention is to solve at least a part of the problems described above, and the invention can be implemented as the following forms or application examples.

Application Example 1

A physical quantity sensor according to this application example includes: a movable body that includes a rotation shaft, a coupling portion that is connected with the rotation shaft and is provided in a direction intersecting with the rotation shaft, and a mass portion that is connected with the coupling portion; a measurement electrode that is provided on a support substrate and is opposed to the mass portion; and a protrusion that is provided in a region where the measurement electrode is provided and protrudes from the support substrate toward the mass portion. In the intersecting direction, in a case where a distance from a connection position between the coupling portion and the mass portion to an end portion of the mass portion opposite to the rotation shaft is L, and a distance from the protrusion to an end portion of the mass portion opposite to the rotation shaft is L1, the distance L1 is 0.5 L or longer and 3.1 L or shorter.

According to this application example, the mass portion of the physical quantity sensor is connected to the coupling portion that is connected to the rotation shaft and is provided in the intersecting direction that intersects with the rotation shaft. In a case where an acceleration is applied to the physical quantity sensor, the movable body rocks around the rotation shaft. Moreover, a protrusion that protrudes toward the mass portion is provided on the support substrate. In the intersecting direction, in a case where a distance from a connection position between the coupling portion and the mass portion to an end portion of the mass portion opposite to the rotation shaft is L, and a distance from the protrusion to an end portion of the mass portion opposite to the rotation shaft is L1, the protrusion of the present application example is positioned in a range of L1=0.5 L or more and L1=3.1 L or less.

In the physical quantity sensor in the related art, when excessive impact is applied to the physical quantity sensor and the movable body and the protrusion comes into contact with each other, there were cases that breakage may occur at the boundary portion where the mass portion and the coupling portion are connected due to the bending stress generated in the coupling portion. The inventors of the invention have found that the breakage occurs when compressive stress acts on a front surface side (surface opposite to support substrate (glass substrate)) of the coupling portion and tensile stress acts on a rear surface side (surface opposite to support substrate) of the coupling portion, and no breakage occurs when tensile stress acts on the front surface side of the coupling portion, and compressive stress act on the rear surface side of the coupling portion. That is, even with the physical quantity sensor in which the rear surface of the movable body including the coupling portion is damaged by the etching gas, it is possible to suppress the breakage by bending the movable body to the side opposite to the support substrate in a convex shape (upward convex) when excessive impact is applied. As a result of calculating the bending stress generated when a load is applied to the movable body including the coupling portion using the position of the protrusion as a parameter, it was possible to convexly bend the movable body upward by providing the protrusion at a position of L1=0.5 L or more. L1=3.1 L is a limit value of the position where the protrusion can be provided in the configuration of the physical quantity sensor. Therefore, by providing the protrusion in a range of L1=0.5 L or more and L1=3.1 L or less, it is possible to provide a physical quantity sensor with excellent impact resistance and improved reliability.

Application Example 2

In the physical quantity sensor according to the application example, it is preferable that a plurality of the protrusions are provided in a straight line parallel to the rotation shaft.

According to this application example, a plurality of the protrusions protruding from the support substrate toward the mass portion are provided in a straight line parallel to the rotation shaft. Accordingly, it is possible to distribute the impact received when the movable body and the protrusion come into contact with each other.

Application Example 3

In the physical quantity sensor according to the application example, it is preferable that the protrusions are provided in line symmetry with respect to a center line that divides the movable body into two in an axial line direction of the rotation shaft.

According to this application example, since the provided protrusions are provided in line symmetry with respect to a center line that divides the movable body into two in an axial line direction of the rotation shaft, it is possible to stabilize an attitude of the movable body when the movable body comes into contact with the protrusion.

Application Example 4

In the physical quantity sensor according to the application example, it is preferable that two mass portions are disposed in line symmetry with respect to the rotation shaft, and the protrusions are disposed in line symmetry with respect to the rotation shaft.

According to this application example, the protrusions are provided in line symmetry with respect to the rotation shaft. In a case where the protrusions are provided asymmetrically with respect to the rotation shaft, it is necessary to make the heights of the protrusions different in order to make the rock angles of the two mass portions the same. The number of processes for forming the protrusions increases in order to form protrusions having different heights. However, by providing the protrusion in line symmetry with respect to the rotation shaft, it is possible to make rock angles of the two mass portions equal using protrusions having the same height. It is possible to efficiently manufacture a physical quantity sensor in which the rock angles of the two mass portions are made equal by the protrusion.

Application Example 5

In the physical quantity sensor according to the application example, it is preferable that the mass portion has an opening that penetrates in a lattice shape, and the protrusions are provided at a position corresponding to a center of four openings forming two rows and two columns.

According to this application example, the mass portion has an opening that penetrates in a lattice shape. Since drag (damping) due to air generated between the movable body and the support substrate is reduced, sensitivity for measuring the physical quantity improves. The protrusions are provided at a position corresponding to a center of four openings forming two rows and two columns. In other words, the protrusions are provided at a position that does not coincide with the opening. It is possible to suppress breakage of the mass portion by the protrusion coming into contact with the opening.

Application Example 6

In the physical quantity sensor according to the application example, it is preferable that the movable body has a slit formed between the coupling portion and the mass portion, and the coupling portion is extended by the slit.

According to this application example, the movable body has a slit formed between the coupling portion and the mass portion, and the coupling portion is extended by the slit. Since the bending stress applied to the coupling portion is reduced, it is possible to further suppress the breakage occurring in the boundary portion between the coupling portion and the mass portion.

Application Example 7

In the physical quantity sensor according to the application example, it is preferable that, in a plan view, the coupling portion overlaps the measurement electrode.

According to this application example, the coupling portion overlaps the measurement electrode. The physical quantity sensor obtains an acceleration based on changes in electrostatic capacitance generated by the measurement electrode and the mass portion opposite to the measurement electrode. Since the coupling portion of the present application example overlaps the measurement electrode, it has the same function as the mass portion that generates the electrostatic capacitance. The generated electrostatic capacitance increases and sensitivity for measuring an acceleration is improved.

Application Example 8

In the physical quantity sensor according to the application example, it is preferable that, in a plan view, the protrusion overlaps the coupling portion.

According to this application example, even in a case where the coupling portion is extended by the slit, it is possible to provide the protrusion at a side close to the rotation shaft.

Application Example 9

In the physical quantity sensor according to the application example, it is preferable that a support portion that supports the movable body is provided between the rotation shaft and the mass portion, and a width of a slit formed between the support portion and the mass portion is 3 μm or less.

According to this application example, the support portion that supports the movable body is provided between the rotation shaft and the mass portion. The slit is formed between the support portion and the mass portion, and the mass portions rock with respect to the support portion via the rotation shaft by the slit. In the application example, the width of the slit is 3 μm or less. There is a case that the mass portion may be displaced in a plane of the mass portion when the mass portion rocks (out-of-plane displacement) around the rotation shaft. Since the slit does not disturb the in-plane displacement generated when the mass portion rocks (out-of-plane displacement) around the rotation shaft, accuracy for measuring the acceleration improves. When strong impact is applied in an in-plane direction, the slit becomes a stopper that can reduce excessive in-plane displacement, and since the in-plane displacement of the mass portion is suppressed to 3 μm or less, it is possible to realize a physical quantity sensor with high reliability.

Application Example 10

A complex sensor according to this application example includes: the physical quantity sensor according to the above-described application example and an angular velocity sensor.

According to this application example, the complex sensor can be easily configured, and for example, acceleration data and angular velocity data may be obtained.

Application Example 11

An inertial measurement unit according to this application example includes: the physical quantity sensor according to any one of the above-described application examples; an angular velocity sensor; and a control unit that controls the physical quantity sensor and the angular velocity sensor.

According to this application example, it is possible to provide an inertial measurement unit with higher reliability by the physical quantity sensor with improved impact resistance.

Application Example 12

A portable electronic device according to this application example includes: the physical quantity sensor according to any one of the above-described application examples; a case in which the physical quantity sensor is stored; a processing unit that is stored in the case and processes output data from the physical quantity sensor; a display portion that is stored in the case; and a light-transmissive cover that covers an opening portion of the case.

According to this application example, it is possible to provide a highly reliable portable electronic device with higher control reliability by the output data of the physical quantity sensor with improved impact resistance.

Application Example 13

An electronic device according to this application example includes: the physical quantity sensor according to the above-described application example; and a control unit that performs control based on a measurement signal output from the physical quantity sensor.

According to this application example, it is possible to provide an electronic device provided with the physical quantity sensor with improved reliability.

Application Example 14

A vehicle according to this application example includes: the physical quantity sensor according to the above-described application example; and a control unit that performs control based on a measurement signal output from the physical quantity sensor.

According to this application example, it is possible to provide a vehicle that is provided with the physical quantity sensor with improved reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to drawings. In the following drawings, the scale of each layer and each member is made different from the actual scale in order to make each layer and each member size recognizable.

In FIGS. 1, 2, 10 to 13, and 15 to 20, three axes of an X axis, a Y axis, and a Z axis orthogonal to each other are illustrated, and a leading end side of an arrow illustrating an axial direction is a "+side", and a base end side thereof is a "−side", for the sake of explanation. Hereinafter, a direction parallel to the X axis is referred to as an "X axis direction", a direction parallel to the Y axis is referred to as a "Y axis direction", and a direction parallel to the Z axis is referred to as a "Z axis direction".

First Embodiment

Configuration of Physical Quantity Sensor

Figure 1:
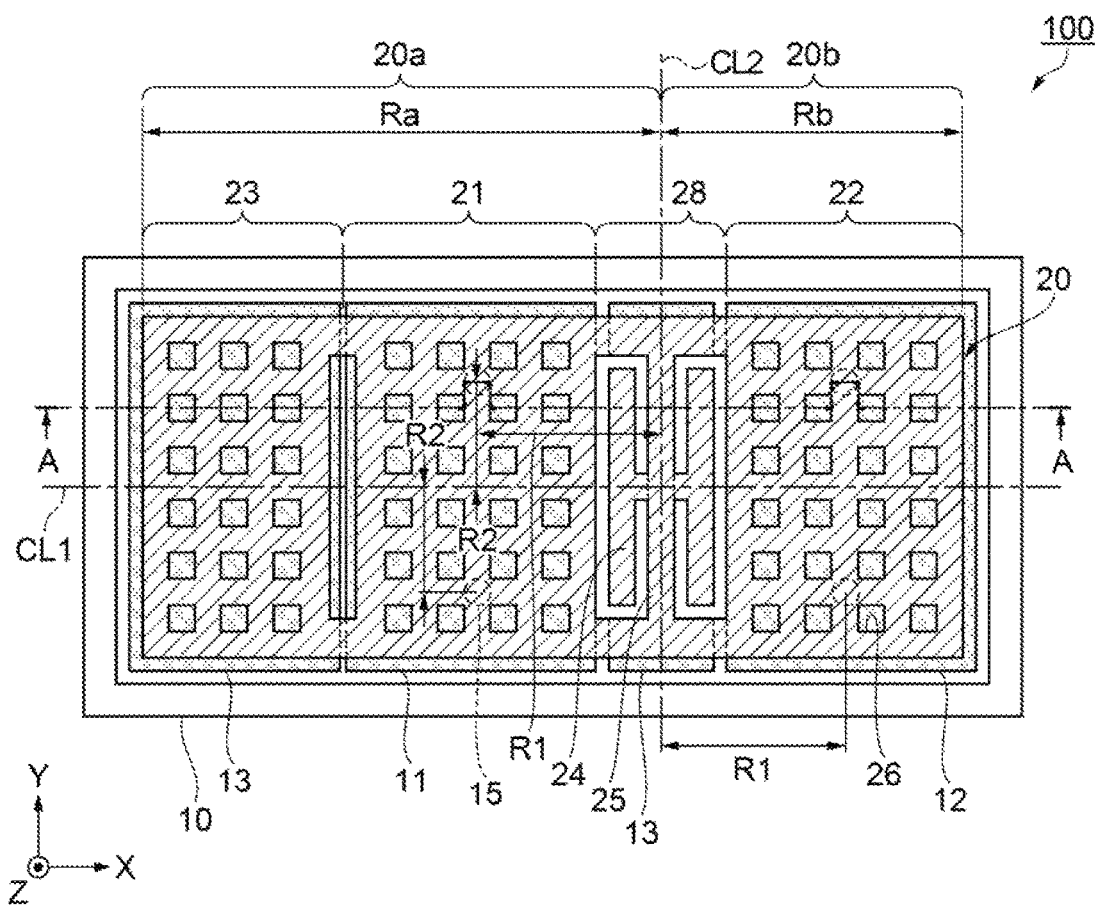
FIG. 1 is a plan view schematically illustrating a physical quantity sensor according to a first embodiment.
Figure 2:
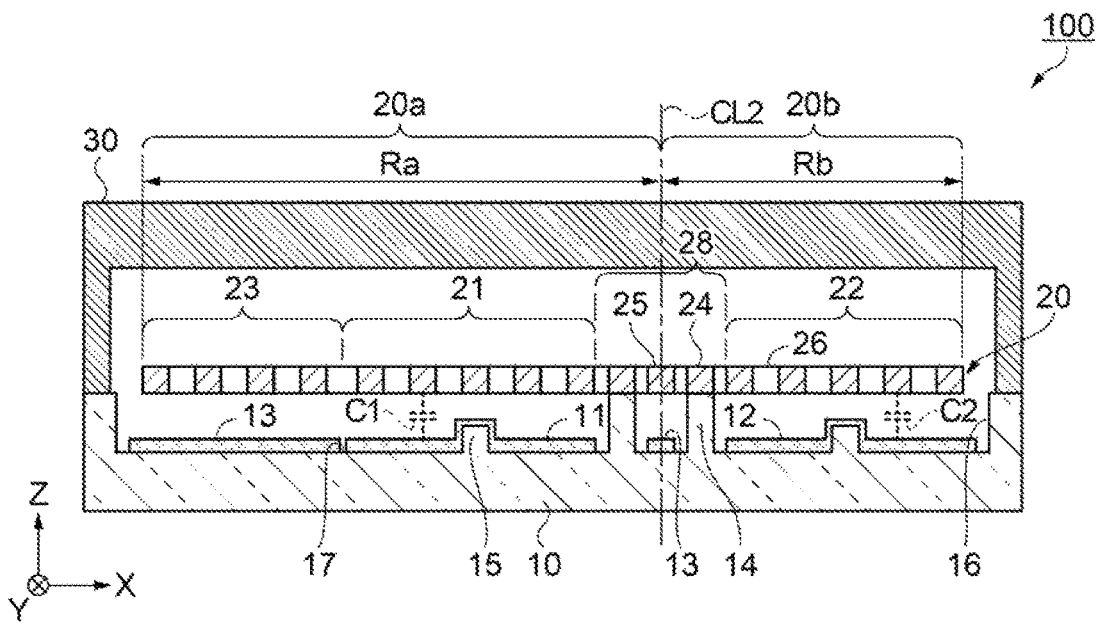
FIG. 2 is a sectional view taken along line A-A in FIG. 1.

FIG. 1 is a plan view schematically illustrating a physical quantity sensor according to a first embodiment. FIG. 2 is a sectional view taken along line A-A in FIG. 1. First, a schematic configuration of a physical quantity sensor 100 according to an embodiment will be described with reference to FIGS. 1 and 2. In FIG. 1, for the sake of explanation, an illustration of a lid 30 is omitted.

The physical quantity sensor 100 of the present embodiment can be used as, for example, an inertial sensor. Specifically, for example, it is possible to use the physical quantity sensor 100 as an acceleration sensor (electrostatic capacitance type acceleration sensor, electrostatic capacitance type MEMS acceleration sensor) for measuring an acceleration in a vertical direction (Z axis direction). In the present embodiment, the vertical direction is referred to as the Z axis, an axial line direction of the rotation shaft (beam 25) described later as the Y axis, and a direction intersecting with both the Z axis and the Y axis as the X axis.

As illustrated in FIGS. 1 and 2, the physical quantity sensor 100 includes a flat plate shaped movable body 20, a support substrate 10 that supports the movable body 20, and the lid 30 that contains the movable body 20 with the support substrate 10.

The support substrate 10 has a concave cavity 16. On a main surface 17 in the cavity 16, first and second fixed electrodes 11 and 12 as a measurement electrode, a dummy electrode 13 and protrusions 15 are provided. A support column 14 that supports the movable body 20 with an interval therebetween is provided between the first fixed electrode 11 and the second fixed electrode 12. The protrusion 15 that protrudes toward the movable body 20 side (+Z axis side) is provided on both sides of the support column 14 in the X axis direction. The support column 14 and the protrusion 15 are formed integrally with the support substrate 10. The material of the support substrate 10 is not particularly limited, but in the present embodiment, as a preferred example, borosilicate glass (hereinafter, glass) that is an insulating material is adopted.

The first and second fixed electrodes 11 and 12 are provided on the support substrate 10. Specifically, the first fixed electrode 11 is positioned in a −X axis side of the support column 14 in a side plan view from the Y axis direction, and is provided in a region that is opposed to and overlaps a first mass portion 21 described later in a plan view from the Z axis direction. The second fixed electrode 12 is positioned in the +X axis side of the support column 14 in the side plan view from the Y axis direction, and is provided in a region that is opposed to and overlaps a second mass portion 22 described later in a plan view from the Z axis direction. The dummy electrode 13 is provided on the main surface 17 other than the first and second fixed electrodes 11 and 12. As a material of the first and second fixed electrodes 11 and 12 and the dummy electrode 13, for example, a conductive film such as Pt (platinum), Al (aluminum), Mo (molybdenum), Cr (chromium), Ti (titanium), Ni (nickel), Cu (copper), Ag (silver), Au (gold), or, ITO (Indium Tin Oxide) can be applied.

The physical quantity sensor 100 includes the protrusion 15 that limits a displacement of the movable body 20 on the main surface 17 of the support substrate 10 to prevent the displaced (rocking) movable body 20 and the support substrate 10 from coming into contact with each other when an excessive acceleration is applied. The protrusions 15 are provided in a region that the first fixed electrode 11 is provided and a region that the second fixed electrode 12 is provided, and protrude from the support substrate 10 toward the first and second mass portions 21 and 22. The protrusion 15 has a cylindrical shape and diameter thereof is approximately 3 to 5 μm. Since the displacement of the movable body 20 is suppressed by the protrusion 15, collision energy when the movable body 20 and the protrusion 15 collide is smaller than the collision energy when an end portion of the movable body 20 collides with the support substrate 10. Accordingly, since the impact resistance of the movable body 20 improves, it is possible to suppress breakage of the movable body 20.

The movable body 20 includes a support portion 24 and the beam 25 as a rotation shaft. The support portion 24 is fixed to the support column 14 and is coupled with the support substrate 10. The support portion 24 has a rectangle shape long in the Y axis direction, and two of the support portions 24 are provided in parallel with the beam 25 interposed in between. The two support portions 24 are coupled in the middle. The beam 25 is supported with the support portion 24 and extends from a center of the support portion 24 in the Y axis direction. The beam 25 has a function as a so-called torsion spring. The beam 25 rockably supports the entire movable body 20 with respect to the support substrate 10 via the support portion 24 and the support column 14.

Two mass portions are disposed in line symmetry with respect to the beam 25 as a rotation shaft. Specifically, the movable body 20 has a first movable body 20a and a second movable body 20b. The first movable body 20a is a region on a −X axis direction side from a center line CL2 as a rotational center of the beam 25, and the second movable body 20b is a region on a +X axis direction side from the center line CL2 as a rotational center of the beam 25. In the first movable body 20a, the first mass portion 21 as a mass portion and a third mass portion 23 are provided in series from the beam 25 toward the −X axis direction. The second mass portion 22 as a mass portion is provided in the second movable body 20b. The first and second mass portions 21, 22 are provided in line symmetry with respect to the center line CL2, in the plan view from the Z axis direction, the first mass portion 21 is positioned in a region overlapping the first fixed electrode 11, and the second mass portion 22 is positioned at a region overlapping the second fixed electrode 12.

The movable body 20 is supported with the beam 25 and can rock around the beam 25 as a rotation shaft. As the movable body 20 rocks (tilts) in a seesaw manner with the beam 25 as a support point, the gap (distance) between the first mass portion 21 and the first fixed electrode 11 and the gap (distance) between the second mass portion 22 and the second fixed electrode 12 change. The physical quantity sensor 100 obtains an acceleration from the changes in electrostatic capacitance C1 and C2 generated between the first mass portion 21 and the first fixed electrode 11 and between the second mass portion 22 and the second fixed electrode 12 according to the tilting of the movable body 20.

Specifically, in a case where an acceleration (for example, gravitational acceleration) is applied to the movable body 20 in the vertical direction (Z axis direction), a rotational moment (moment of force) is generated in each of the first movable body 20a and the second movable body 20b. Here, in a case where a rotational moment of the first movable body 20a (for example, counterclockwise rotational moment) and a rotational moment of the second movable body 20b (for example, clockwise rotational moment) are balanced, no change occurs in the tilt of the movable body 20, and thereby the acceleration cannot be measured. Therefore, the movable body 20 is designed in a manner that when the acceleration is applied in the vertical direction, the rotational moment of the first movable body 20a and the rotational moment of the second movable body 20b are not balanced, so that a predetermined tilt is generated in the movable body 20.

The physical quantity sensor 100 is disposed at a position that the beam 25 is deviated from the center of gravity of the movable body 20 in the X axis direction. In other words, since the third mass portion 23 is provided in the first movable body 20a, a distance Ra from the center line CL2 as a rotation shaft of the beam 25 to an end surface of the first movable body 20a and a distance Rb from the center line CL2 to an end surface of the second movable body 20b are different. Accordingly, the first movable body 20a and the second movable body 20b have different masses from each other. That is, the movable body 20 has different mass on one side (first movable body 20a) and the other side (second movable body 20b) with the center line CL2 of the beam 25 as an origin. By differentiating the masses of the first movable body 20a and the second movable body 20b, it is possible to unbalance the rotational moment of the first movable body 20a and the rotational moment of the second movable body 20b generated when an acceleration is applied to the movable body 20 in the vertical direction. Accordingly, when an acceleration is applied to the physical quantity sensor 100 in the vertical direction, the movable body 20 is tilted.

The electrostatic capacitance (changeable electrostatic capacitance) C1 is constituted between the first mass portion 21 and the first fixed electrode 11. The electrostatic capacitance (changeable electrostatic capacitance) C2 is constituted between the second mass portion 22 and the second fixed electrode 12. The electrostatic capacitance C1 changes its electrostatic capacitance in accordance with the gap (distance) between the first mass portion 21 and the first fixed electrode 11, and the electrostatic capacitance C2 changes its electrostatic capacitance in accordance with the gap (distance) between the second mass portion 22 and the second fixed electrode 12.

For example, in a case where the movable body 20 is horizontal with respect to the support substrate 10, the electrostatic capacitance C1 and C2 becomes an electrostatic capacitance value approximately equal to each other. Specifically, since the overlapping area of the first mass portion 21 and the first fixed electrode 11 and the overlapping area of the second mass portion 22 and the second fixed electrode 12 are equal in the plan view from the Z axis direction, and the gap between the first mass portion 21 and the first fixed electrode 11 and the gap between the second mass portion 22 and the second fixed electrode 12 in the side plan view from the Y direction are equal, the electrostatic capacitance values of the electrostatic capacitance C1 and C2 are equal. For example, when an acceleration is applied to the movable body 20 in the vertical direction and the movable body 20 tilts around the beam 25 as a rotation shaft, the electrostatic capacitance values of the electrostatic capacitance C1 and C2 change according to the tilting of the movable body 20 in the electrostatic capacitance C1 and C2. In a case where the movable body 20 is tilted, since the gap between the first mass portion 21 and the first fixed electrode 11 and the gap between the second mass portion 22 and the second fixed electrode 12 are different, the electrostatic capacitance values of the electrostatic capacitance C1 and C2 differ.

When an acceleration is applied to the movable body 20 in the vertical direction and the movable body 20 rocks, damping is caused by viscosity of gas (function to stop the movement of the movable body, flow resistance). A plurality of openings 26 that penetrates the movable body 20 in a thickness direction are provided in the movable body 20 in order to reduce the damping. The first and second mass portions 21 and 22 and the third mass portion 23 as the mass portion of the present embodiment have square openings 26 penetrating in a lattice shape. Accordingly, the damping of the movable body 20 reduces and the sensitivity for measuring the acceleration improves. The plurality of openings 26 may have different shapes individually. The position where the openings 26 are disposed and the number thereof can be freely set.

The movable body 20 includes a coupling portion 28. The coupling portion 28 is connected with the beam 25 as a rotation shaft, and is provided in an intersecting direction (X axis direction) intersecting with the beam 25. The coupling portion 28 is connected with the first mass portion 21 and the second mass portion 22. That is, the coupling portion 28 extends from the beam 25 in both directions of the X axis direction and is connected to the first mass portion 21 and the second mass portion 22.

The material of such a movable body 20 is not particularly limited, but in the present embodiment, as a preferred example, silicon which is a conductive material is adopted. By using a conductive material in the movable body 20, it is possible to impart a function as an electrode to the first mass portion 21 that is a region overlapping the first fixed electrode 11 and the second mass portion 22 that is a region overlapping the second fixed electrode 12. The first and second mass portions may be formed of a conductive electrode layer provided on a nonconductive substrate using a nonconductive substrate to the movable body.

Next, the disposal of the protrusions 15 will be described in detail.

In the present embodiment, a plurality of the protrusions (2 each) 15 are provided in the first fixed electrode 11 overlapping the first mass portion 21, and the second fixed electrode 12 overlapping the second mass portion 22. The plurality of protrusions 15 are provided in a straight line parallel to the beam 25 as a rotation shaft. Accordingly, it is possible to distribute impact received when the movable body 20 and the protrusions 15 come into contact with each other. The protrusions 15 are provided at a line symmetry position of a distance R2 with respect to a center line CL1 that divides the movable body 20 into two in an axial line direction (Y axis direction) of the beam 25 as a rotation shaft. The attitude of the movable body 20 can be stabilized when the first and second mass portions 21 and 22 come into contact with the protrusion 15.

The protrusions 15 are provided at a line symmetry position of a distance R1 with respect to the center line CL2 that is a rotational center of the beam 25. By providing the protrusions 15 having the same height in line symmetry with respect to the beam 25, the rock angles (rotation angles) of the first mass portion 21 and the second mass portion 22 that rock around the beam 25 can be the same. Accordingly, the accuracy for measuring the physical quantity of the physical quantity sensor 100 can be improved. In a case where the protrusions 15 are provided at positions asymmetrically with respect to the beam 25, it is necessary to make the heights of the protrusions 15 different in order to make the rock angles of the first mass portion 21 and the second mass portion 22 the same. In order to form protrusions 15 having different heights on the support substrate 10, in the manufacturing method of the physical sensor described later, the number of steps (number of times of patterning) for forming the protrusions 15 increases, and production efficiency decreases. In the physical quantity sensor 100 of the present embodiment, since the protrusions 15 are provided in line symmetry with respect to the beam 25, it is possible to make the rock angles of the first mass portion 21 and the second mass portion 22 equal using protrusions 15 having the same height.

Such protrusions 15 are provided at a position corresponding to a center of four openings 26 forming two rows and two columns. In other words, the protrusions 15 are provided at a position that does not coincide with the opening 26. As the protrusion 15 contacts the end portion (edge) of the opening 26, it is possible to suppress breakage of the first and second mass portions 21, 22.

In the present embodiment, a configuration that two protrusions 15 are provided in each region in which the first and second fixed electrodes 11 and 12 are provided is illustrated, but the configuration is not limited to this. A configuration in which one protrusion 15 is provided in each region or a configuration in which three or more protrusions are provided in each region may be applied. The protrusion 15 has a cylindrical shape, but it may have a polygonal prism shape such as a triangular prism or square pillar, or a shape in which an upper surface thereof is chamfered. A protective film with insulating property may be formed on the surface of the protrusion 15. Accordingly, it is possible to prevent electrical short circuit when the first and second mass portions 21 and 22 and the protrusion 15 come into contact with each other.

The position of the protrusion 15 in the X axis direction will be described.

In the present embodiment, in the intersecting direction (X axis direction), in a case where a distance from connection positions between the coupling portion 28 and the first and second mass portions 21 and 22 to end portions of the first and second mass portions 21 and 22 opposite to the beam 25 is L, and a distance from the protrusion 15 to end portions of the first and second mass portions 21 and 22 opposite to the beam 25 is L1, the protrusion 15 is provided in a range of L1=0.5 L or more.

Figure 3:
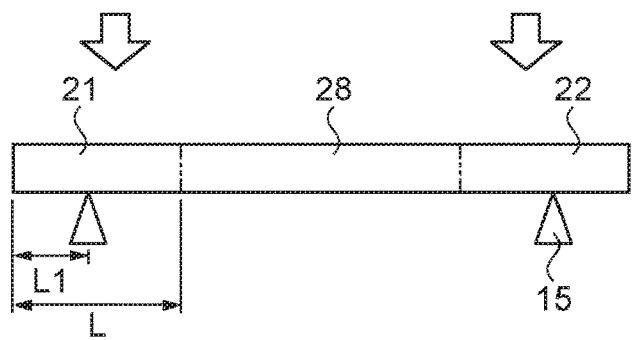
FIG. 3 is a view illustrating a beam loaded model for calculating bending stress applied to a movable body.
Figure 4:
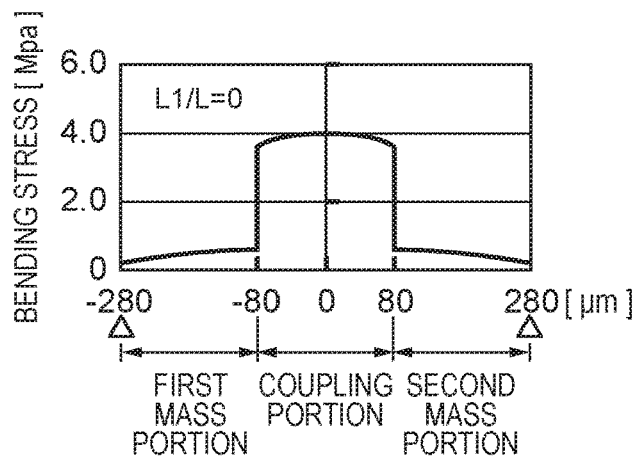
FIG. 4 is a graph illustrating calculation results of the bending stress applied to the movable body.
Figure 5:
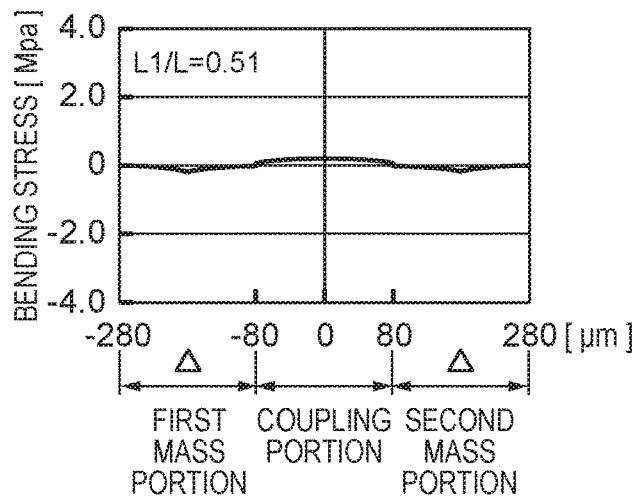
FIG. 5 is a graph illustrating calculation results of the bending stress applied to the movable body.
Figure 6:
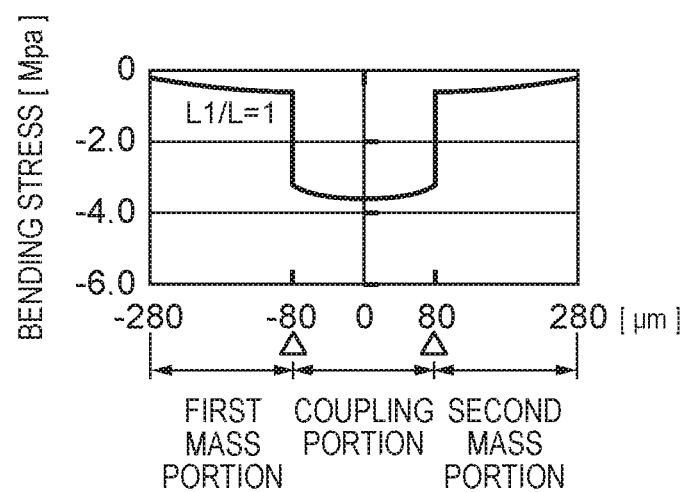
FIG. 6 is a graph illustrating calculation results of the bending stress applied to the movable body.
Figure 7:
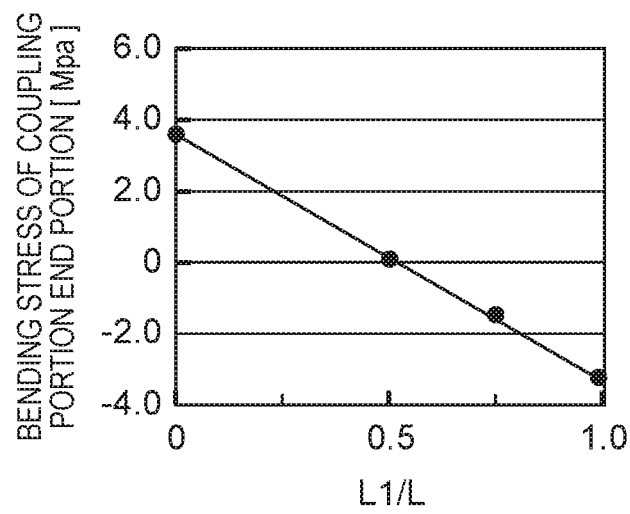
FIG. 7 is a graph illustrating a relationship between positions of a protrusion and bending stress.

FIG. 3 is a view illustrating a beam loaded model for calculating bending stress applied to a movable body. FIGS. 4 to 6 are graphs illustrating calculation results of the bending stress applied to the movable body. FIG. 7 is a graph illustrating a relationship between positions of a protrusion and bending stress.

Next, the bending stress that the movable body 20 receives when excessive impact is applied to the physical quantity sensor 100 in the vertical direction will be described.

As illustrated in FIG. 3, in the state when large impact is applied to the physical quantity sensor 100 in the vertical direction, the protrusion 15 serves as a support point in a case where the support portion 24, the beam 25, and the third mass portion 23 are ignored, and the state is considered equivalent to a distributed load beam model having different supports at both ends. In the intersecting direction (X axis direction), when a distance from connection positions between the coupling portion 28 and the first and second mass portions 21 and 22 to end portions of the first and second mass portions 21 and 22 opposite to the beam 25 is L, and a distance from the protrusion 15 to end portions of the first and second mass portions 21 and 22 opposite to the beam 25 is L1, the position of the protrusion 15, that is, the bending stress when L1 was changed was calculated. The lengths of the coupling portion 28 and the first and second mass portions 21, 22 are constant. In the description below, the position L1 of the protrusion 15 may be indicated as a ratio (L1/L) to the distance L from the connection positions between the coupling portion 28 and the first and second mass portions 21 and 22 to end portions of the first and second mass portions 21 and 22 opposite to the beam 25. The length of the coupling portion 28 of the beam model used for calculation in the X axis direction is approximately 160 μm, and the width thereof in the Y axis direction is approximately 25 μm. The length of the first and second mass portions in the X axis direction is approximately 200 μm, and thickness of each portion in the Z axis direction is approximately 30 μm.

The bending stress calculation results illustrated in FIG. 4 are the results obtained in a case where the protrusions 15 are positioned at the end portions of the first and second mass portions 21 and 22 opposite to the beam 25 (L1/L=0).

The bending stress calculation results illustrated in FIG. 5 are the results obtained in a case where protrusions 15 are positioned substantially at the center of the first and second mass portions 21 and 22 (L1/L=0.51).

The bending stress calculation results illustrated in FIG. 6 are the results obtained in a case where the protrusions 15 are positioned at the end portions of the first and second mass portions 21 and 22 near the beam 25 (L1/L=1.0).

The horizontal axis of FIGS. 4 to 6 indicates a distance from the beam 25 (rotation shaft), that is, a distance from the center of the coupling portion 28 in the beam model illustrated in FIG. 3. The triangle marks in FIGS. 4 to 6 indicate the positions of the protrusion 15. The vertical axis of FIGS. 4 to 6 indicates the bending stress generated in each portion of the beam model when a load of 4,500 G is applied in the vertical direction in the beam model illustrated in FIG. 3. The arrows illustrated in FIG. 3 indicate the directions of loading.

As is known from the comparison between FIG. 4 and FIG. 5, the bending stress applied at the boundary (hereinafter, referred to as coupling portion end portion) of the coupling portion 28 and the first and second mass portions 21 and 22 is reduced from 3.7 Mpa to 0.1 Mpa by moving the position of the protrusion 15 from L1/L=0 to L1/L=0.51.

As is known from the comparison between FIG. 5 and FIG. 6, by moving the position of the protrusion 15 from L1/L=0.51 to L1/L=1.0, the negative bending stress increases at the coupling portion end portions. The load of 4,500 G corresponds to the maximum impact when the movable body 20 and the protrusion 15 collide by application of an excessive acceleration to the physical quantity sensor 100.

The horizontal axis of FIG. 7 indicates the positions of the protrusions 15 in a ratio of L1/L. The vertical axis of FIG. 7 indicates the bending stress applied to the coupling portion end portions of the beam model.

Figure 8:
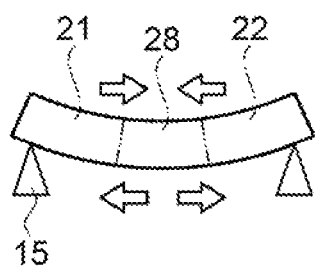
FIG. 8 is a view illustrating a shape of the beam model being displaced when a load is applied.
Figure 9:
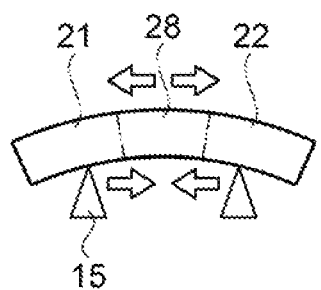
FIG. 9 is a view illustrating a shape of the beam model being displaced when a load is applied.

FIGS. 8 and 9 are views illustrating a shape of the beam model being displaced when a load is applied. In the vertical axis of FIG. 7, the case where compressive stress is generated on the front surface (surface on +Z axis side) of the beam model and tensile stress is generated on the rear surface (surface on −Z axis side) of the beam model and the beam model is convexly bent downward as illustrated in FIG. 8 is indicated by a positive (plus) stress value. In the vertical axis of FIG. 7, the case where tensile stress is generated on the front surface (surface on +Z axis side) of the beam model and compressive stress is generated on the rear surface (surface on −Z axis side) of the beam model and the beam model is convexly bent upward as illustrated in FIG. 9 is indicated by a negative (minus) stress value. The triangle marks in FIGS. 8 and 9 indicate the positions of the protrusions 15, and the directions of the arrows in FIGS. 8 and 9 indicate the direction of stress on the front and rear surfaces of the beam model.

As is known from FIG. 7, in a region where the position of the protrusion 15 is at less than L1=0.5 L, positive bending stress is generated at the coupling portion end portions. That is, when replaced with the physical quantity sensor 100, when excessive impact is applied to the physical quantity sensor 100 and the movable body 20 and the protrusion 15 come into contact with each other, the movable body 20 convexly bends (downward convex) to the support substrate 10 side.

In a region where the position of the protrusion 15 is L1=0.5 L or more, negative bending stress is applied at the coupling portion end portions. That is, when replaced with the physical quantity sensor 100, when excessive impact is applied to the physical quantity sensor 100 and the movable body 20 and the protrusion 15 come into contact with each other, the movable body 20 convexly bends (upward convex) opposite to the support substrate 10.

The inventors of the invention have found that in a case where the movable body 20 is convexly bent upward, breakage does not occur at the boundary between the coupling portion 28 and the first and the second mass portions 21 and 22. The inventors made samples having the protrusions 15 at different positions, and as a result of carrying out an impact resistance test, the substantially same bending stress having opposite signs occurred in the samples in which the position of the protrusion 15 is L1/L=0 and the position of the protrusion 15 is L1/L=1.0, but no breakages occurred in the samples in which the position of the protrusion 15 is set to L1/L=1.0.

Here, the damage on the rear surface of the movable body 20 and the breakage of the movable body 20 will be explained.

Figure 17:
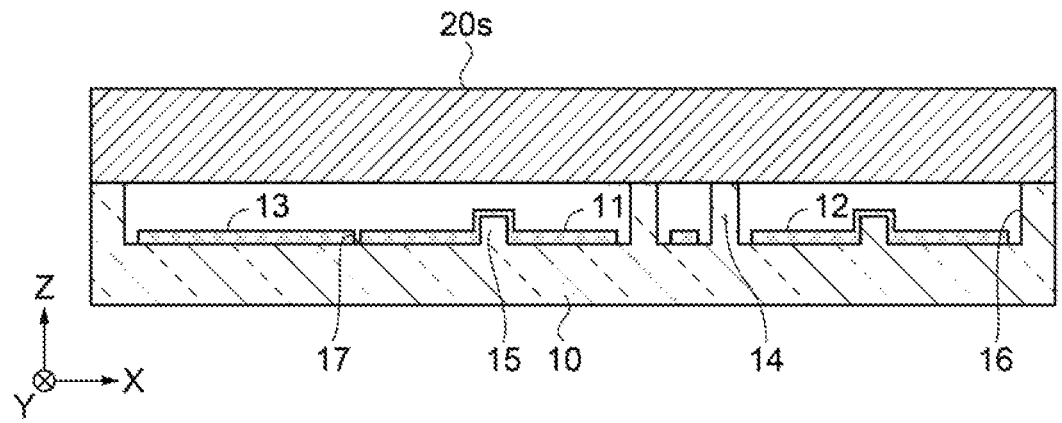
FIG. 17 is a sectional view of the physical quantity sensor in each manufacturing process.

In a movable body forming step of manufacturing method of the physical quantity sensor described later, the movable body 20 is formed by through-etching on the silicon substrate 20S (See FIG. 17). When etching the silicon substrate 20S, the rear surface of the movable body 20 including the coupling portion 28 is damaged and is eroded in microcracks by the wrapped etching gas into the interval between the rear surface of the silicon substrate and the glass substrate from a portion penetrated first by micro loading effect.

In a case where excessive impact is applied to the damaged physical quantity sensor 100, it is considered that the breakage easily occurs because the movable body 20 is convexly bent downward in the sample with the protrusion position at L1/L=0 in a direction that the microcracks on the rear surface of the movable body 20 are extended. On the other hand, in the sample with the protrusion position at L1/L=1.0, it is considered that no breakage occurs because the movable body 20 is convexly bent upward in a direction that the microcracks on the rear surface of the movable body 20 are narrowed. Therefore, in the physical quantity sensor 100 of the present embodiment, the protrusion 15 is provided in a region between L1/L=0.5 or more and L1/L=1.0 or less that the movable body 20 convexly bends upward. Breakage occurring at the boundary portion between the coupling portion 28 and the first and second mass portions 21 and 22 can be suppressed. L1=1.0 L is an upper limit of a position where the protrusion 15 can be provided in the physical quantity sensor 100 of the present embodiment.

FIGS. 10 to 13 are sectional views schematically illustrating operation of the physical quantity sensor. The relationship between the operation of the physical quantity sensor 100 and electrostatic capacitance will be described with reference to FIGS. 10 to 13. In FIGS. 10 to 13, illustration of configurations not necessary for explanation of the operation is omitted.

Figure 10:
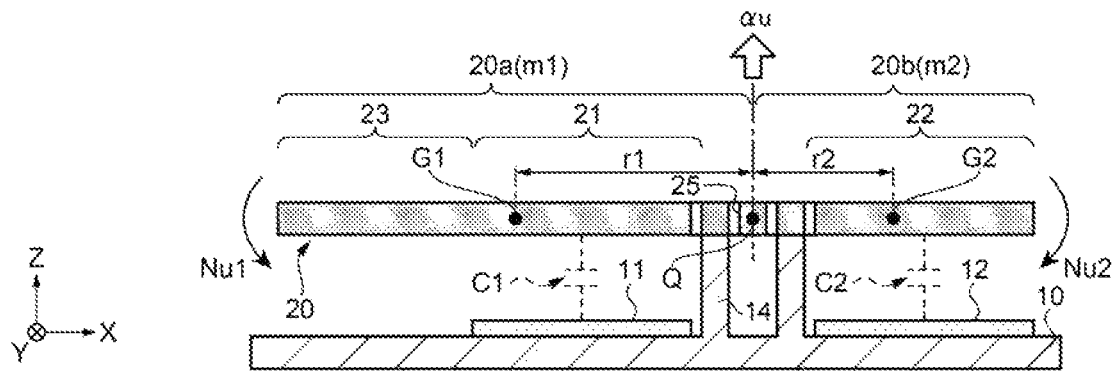
FIG. 10 is a sectional view schematically illustrating operation of the physical quantity sensor.

FIG. 10 illustrates a state in which the movable body 20 is positioned in a substantially horizontal state with respect to the support substrate 10. A case where an acceleration αu in the +Z axis direction is applied to the physical quantity sensor 100 in this state will be described.

The movable body 20 has a flat plate-like rectangular shape having a uniform thickness (dimension in the Z axis direction). The first movable body 20a has a mass m1 and its center of gravity G1 is positioned at a distance r1 in the −X axis direction from a center Q of the beam 25 rotatably supported by the support portion 24. The second movable body 20b has a mass m2, and its center of gravity G2 is positioned at a distance r2 in the +X axis direction from the center Q of the beam 25. The first movable body 20a has the third mass portion 23 and has a rectangular shape longer than the second movable body 20b in the X axis direction. Therefore, the mass m1 of the first movable body 20a is heavier than the mass m2 of the second movable body 20b, and the distance r1 where the center of gravity G1 of the first movable body 20a is positioned is longer than the distance r2 where the center of gravity G2 of the second movable body 20b is positioned.

When the acceleration αu directed from the −Z axis direction to the +Z axis direction is applied to the physical quantity sensor 100, a first rotational moment Nu1 corresponding to the product of the mass m1, the acceleration αu, and the distance r1 acts on the first movable body 20a in a counterclockwise direction around the center Q of the beam 25 as a rotation shaft. On the other hand, a second rotational moment Nu2 corresponding to the product of the mass m2, the acceleration αu, and the distance r2 acts on the second movable body 20b in a clockwise direction around the center Q of the beam 25 as a rotation shaft. Since the mass m1 of the first movable body 20a is heavier than the mass m2 of the second movable body 20b and the distance r1 where the center of gravity G1 of the first movable body 20a is positioned is longer than the distance r2 where the center of gravity G2 of the second movable body 20b is positioned, the first rotational moment Nu1 acting on the first movable body 20a is larger than the second rotational moment Nu2 acting on the second movable body 20b.

Figure 11:
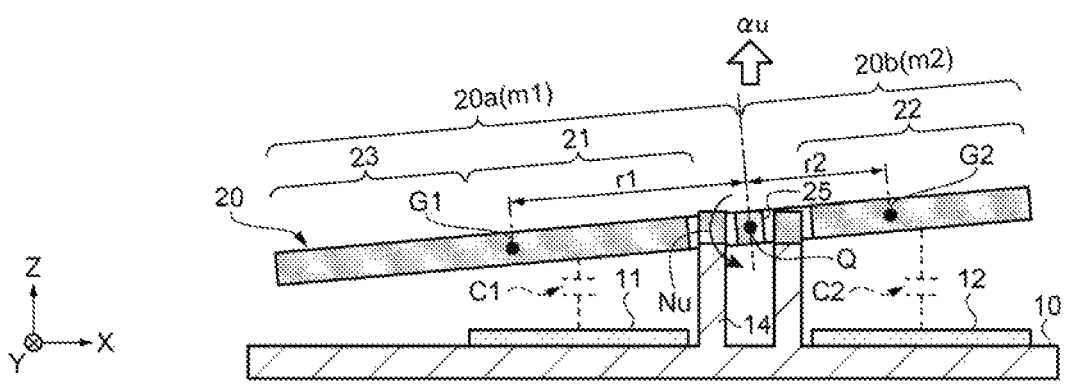
FIG. 11 is a sectional view schematically illustrating operation of the physical quantity sensor.

Accordingly, as illustrated in FIG. 11, a torque Nu corresponding to the difference between the first rotational moment Nu1 (see FIG. 10) and the second rotational moment Nu2 (see FIG. 10) acts on the beam 25 in a counterclockwise direction around the center Q of the beam 25 as a rotation shaft, and the movable body 20 is tilted counterclockwise. The gap between the first mass portion of the first movable body 20a and the first fixed electrode 11 becomes small (narrow), and the electrostatic capacitance value of the electrostatic capacitance C1 formed between the first mass portion 21 and the first fixed electrode 11 increases. On the other hand, the gap between the second mass portion 22 of the second movable body 20b and the second fixed electrode 12 becomes large (wider), and the electrostatic capacitance value of the electrostatic capacitance C2 formed between the second mass portion 22 and the second fixed electrode 12 decreases.

Figure 12:
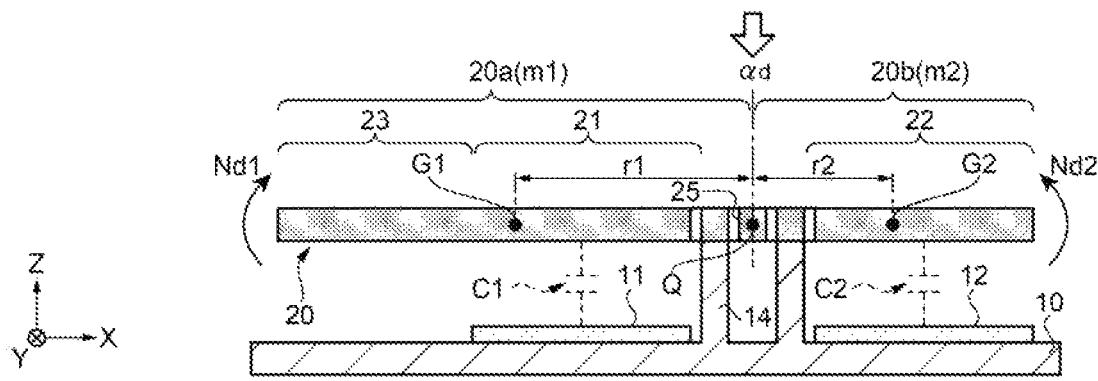
FIG. 12 is a sectional view schematically illustrating operation of the physical quantity sensor.

FIG. 12 illustrates a state in which the movable body 20 is positioned in a substantially horizontal state with respect to the support substrate 10. A case where an acceleration αd in the −Z axis direction is applied to the physical quantity sensor 100 in this state will be described.

When the acceleration αd directed from the +Z axis direction to the −Z axis direction is applied to the physical quantity sensor 100, a first rotational moment Nd1 corresponding to the product of the mass m1, the acceleration αd, and the distance r1 acts on the first movable body 20a in a clockwise direction around the center Q of the beam 25 as a rotation shaft. On the other hand, the second rotational moment Nd2 corresponding to the product of the mass m2, the acceleration αd, and the distance r2 acts on the second movable body 20b in a counterclockwise direction around the center Q of the beam 25 as a rotation shaft. Since the mass m1 of the first movable body 20a is heavier than the mass m2 of the second movable body 20b and the distance r1 where the center of gravity G1 of the first movable body 20a is positioned is longer than the distance r2 where the center of gravity G2 of the second movable body 20b is positioned, the first rotational moment Nd1 acting on the first movable body 20a is larger than the second rotational moment Nd2 acting on the second movable body 20b.

Figure 13:
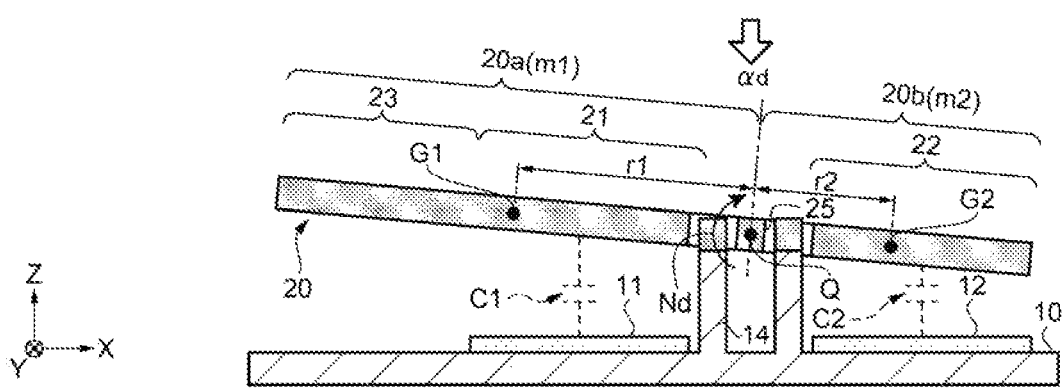
FIG. 13 is a sectional view schematically illustrating operation of the physical quantity sensor.

Accordingly, as illustrated in FIG. 13, a torque Nd corresponding to the difference between the first rotational moment Nd1 (see FIG. 11) and the second rotational moment Nd2 (see FIG. 11) acts on the beam 25 in a clockwise direction around the center Q of the beam 25 as a rotation shaft, and the movable body 20 is tilted clockwise. The gap between the first mass portion 21 of the first movable body 20a and the first fixed electrode 11 becomes large (wider), and the electrostatic capacitance value of the electrostatic capacitance C1 formed between the first mass portion 21 and the first fixed electrode 11 decreases. On the other hand, the gap between the second mass portion 22 of the second movable body 20b and the second fixed electrode 12 becomes small (narrow), and the electrostatic capacitance value of the electrostatic capacitance C2 formed between the second mass portion 22 and the second fixed electrode 12 increases.

In the physical quantity sensor 100, by increasing the torques Nu and Nd acting on the beam 25, that is, by enlarging the difference in mass between the first movable body 20a and the second movable body 20b, by enlarging the difference between the distance r1 from the beam 25 to the center of gravity G1 of the first movable body 20a and the distance r2 from the beam 25 to the center of gravity G2 of the second movable body 20b, the movable body 20 can be largely tilted. Accordingly, since the increase and decrease in the capacitance values of the electrostatic capacitances C1 and C2 becomes large, it is possible to improve the sensitivity for measuring the physical quantity of the physical quantity sensor 100. The physical quantity sensor 100 can increase the tilting of the movable body 20 by narrowing the width of the beam 25 functioning as a torsion spring in the X axis direction and lowering the toughness of the spring. Thereby, it is possible to increase the sensitivity for measuring the physical quantity.

In the present embodiment, the movable body 20 is described as being provided so as to be rockable by the beam 25 supported via the support column 14 or the like provided on the support substrate 10, but it is not limited to this configuration. For example, the movable body may be configured to be rockable by a beam extending from a frame-like support body that surrounds the outer periphery of the movable body and is provided at a predetermined interval from the movable body in the Y axis direction in plan view from the Z axis direction.

Manufacturing Method of Physical Quantity Sensor

Figure 14:
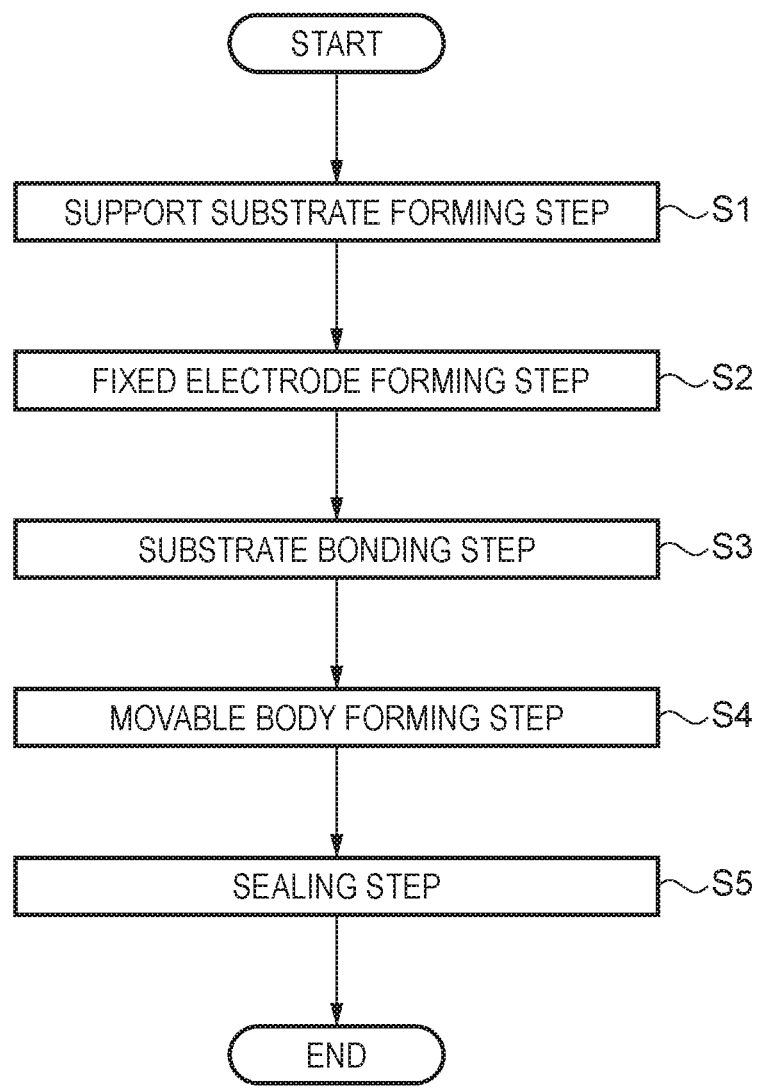
FIG. 14 is a flowchart explaining a manufacturing process of the physical quantity sensor.

FIG. 14 is a flowchart explaining a manufacturing process of the physical quantity sensor. FIGS. 15 to 19 are sectional views of the physical quantity sensor in each manufacturing process. Next, the manufacturing method of the physical quantity sensor 100 will be described with reference to FIGS. 14 to 19.

Figure 15:
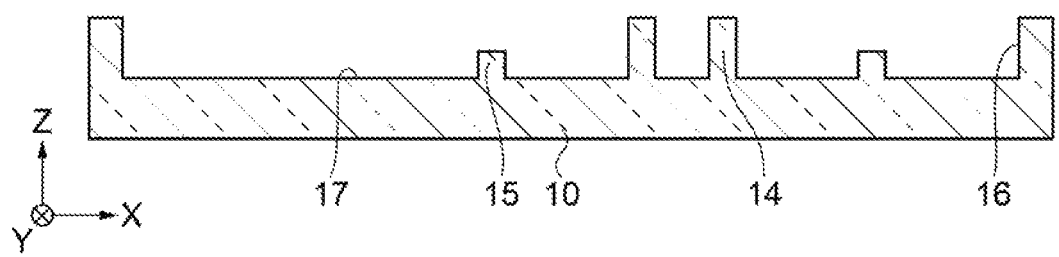
FIG. 15 is a sectional view of the physical quantity sensor in each manufacturing process.

Step S1 is a support substrate forming step of forming the support substrate 10 and the protrusion 15. First, a glass substrate is prepared. In the support substrate forming step, the support substrate 10 and the protrusions 15 are formed by patterning the glass substrate using a photolithography technique and an etching technique. For example, the glass substrate can be wet-etched by using a hydrofluoric acid based etchant. Thereby, it is possible to obtain the support substrate 10 having the concave cavity 16, the support column 14, and the protrusion 15 formed on the glass substrate as illustrated in FIG. 15.

Figure 16:
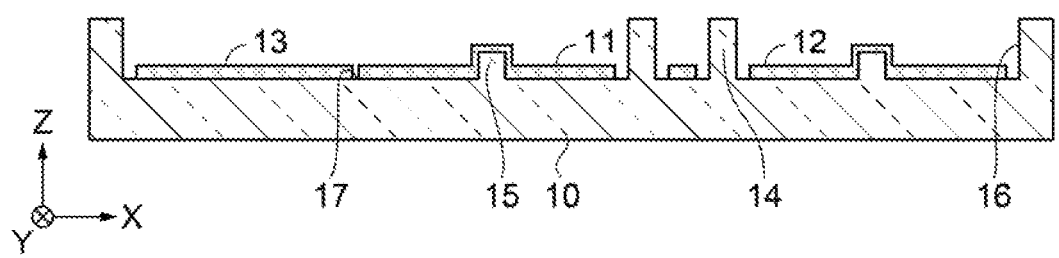
FIG. 16 is a sectional view of the physical quantity sensor in each manufacturing process.

Step S2 is a fixed electrode forming step for forming the first and second fixed electrodes 11 and 12 and the dummy electrode 13. In the fixed electrode forming step, a conductive film is formed on the main surface 17 of the support substrate 10 by a sputtering method or the like, and then the conductive film is patterned using a photolithography technique and an etching technique (dry etching, wet etching, or the like) to form the first and second fixed electrodes 11 and 12 and the dummy electrode 13. Thereby, as illustrated in FIG. 16, the first and second fixed electrodes 11 and 12 and the dummy electrode 13 can be provided on the main surface 17 in the cavity 16 of the support substrate 10.

Step S3 is a substrate bonding step for bonding the support substrate 10 and a silicon substrate 20S. As illustrated in FIG. 17, in the substrate bonding step, for example, the support substrate 10 and the silicon substrate 20S are bonded with each other using, for example, anodic bonding, direct bonding, or an adhesive.

Figure 18:
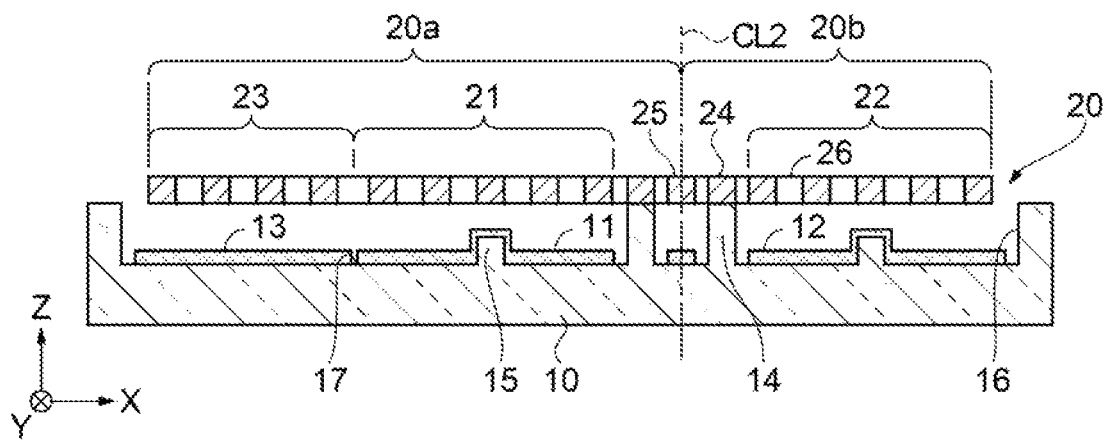
FIG. 18 is a sectional view of the physical quantity sensor in each manufacturing process.

Step S4 is a movable body forming step of forming the movable body 20 having the opening 26 from the silicon substrate 20S. In the movable body forming step, the silicon substrate 20S is ground, for example, using a grinding machine, and thinned to a predetermined thickness. Then, the movable body 20 is formed by patterning the silicon substrate 20S using a photolithography technique and an etching technique. For example, the silicon substrate 20S can be etched by a Bosch process using a reactive ion etching (RIE) apparatus. Thereby, as illustrated in FIG. 18, the movable body 20 including the opening 26, the support portion 24, and the beam 25 is integrally formed.

Figure 19:
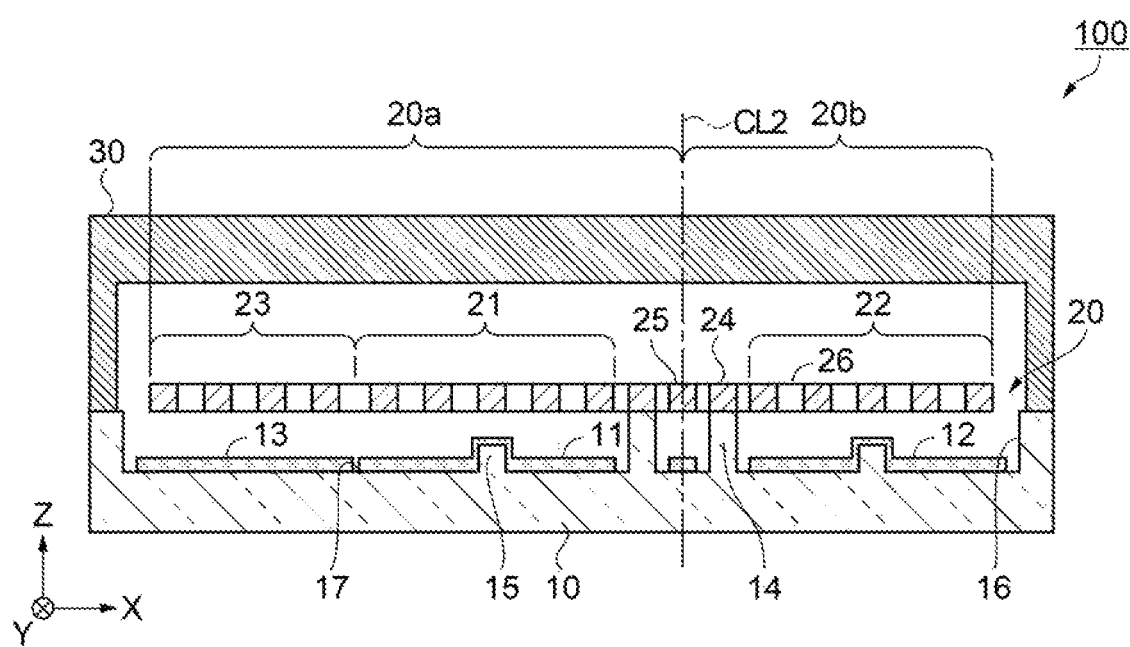
FIG. 19 is a sectional view of the physical quantity sensor in each manufacturing process.

Step S5 is a sealing step for sealing the movable body 20. In the sealing step, the lid 30 is bonded with the support substrate 10, and the movable body 20 is stored in a space formed by the support substrate 10 and the lid 30. The support substrate 10 and the lid 30 are bonded using, for example, anodic bonding, an adhesive, or the like. As illustrated in FIG. 19, the physical quantity sensor 100 is obtained. In a case where anodic bonding is used in the sealing step, it is possible to prevent the movable body 20 from sticking to the support substrate 10 by electrostatic force by forming the dummy electrode 13 having the same potential as that of the silicon substrate 20S on the main surface 17 other than the first and second fixed electrodes 11 and 12 of the support substrate 10.

As described above, according to the physical quantity sensor 100 according to the present embodiment, the following effects can be obtained.

The movable body 20 of the physical quantity sensor 100 includes the first and second mass portions 21 and 22, the beam 25, and the coupling portion 28. The first mass portion 21 and the second mass portion 22 are connected to the coupling portion 28 which is connected to the beam 25 and provided in the intersecting direction intersecting with the beam 25, and the movable body 20 rocks around the beam 25 as a rotation shaft. The protrusions 15 protruding toward the first and second mass portions 21 and 22 are provided on the support substrate 10 supporting the movable body 20 with a gap therebetween. In the intersecting direction (X axis direction), in a case where a distance from connection positions between the coupling portion 28 and the first and second mass portions 21 and 22 to end portions of the first and second mass portions 21 and 22 opposite to the beam 25 is L, and a distance from the protrusion 15 to end portions of the first and second mass portions 21 and 22 opposite to the beam 25 is L1, the protrusions 15 are provided in a range of L1=0.5 L or more and 1.0 L or less. When excessive impact is applied to the physical quantity sensor 100 in which the protrusions 15 are provided in a region L1=0.5 L or more and the movable body 20 comes into contact with the protrusion 15, the movable body 20 convexly bends to the side opposite to the support substrate 10. Even with the physical quantity sensor 100 in which the rear surface of the movable body 20 is damaged, the movable body bends in a direction where the microcracks are narrowed, and it is possible to suppress the breakage occurring at the boundary portion between the coupling portion 28 and the first and second mass portions 21 and 22. Therefore, it is possible to provide the physical quantity sensor 100 having excellent impact resistance and improved reliability.

The plurality of protrusions 15 are provided in the first fixed electrode 11 overlapping with the first mass portion 21 and the second fixed electrode 12 overlapping with the second mass portion 22. The plurality of protrusions 15 are provided in a straight line parallel to the beam 25 as a rotation shaft. Accordingly, it is possible to distribute impact received when the movable body 20 and the protrusions 15 come into contact with each other.

The protrusions 15 are provided at a symmetry position of the distance R2 with respect to the center line CL1 that divides the movable body 20 into two in an axial line direction of the beam 25 as a rotation shaft. The attitude of the movable body 20 can be stabilized when the first and second mass portions 21 and 22 come into contact with the protrusion 15.

The protrusions 15 are provided in a line symmetry with respect to the center line CL2 that is a rotational center of the beam 25. The rock angles of the first mass portion 21 and the second mass portion 22 can be made equal by the protrusions 15 having the same height. Accordingly, the accuracy for measuring the physical quantity of the physical quantity sensor 100 can be improved. In a case where the protrusions 15 are provided at positions asymmetrically with respect to the beam 25, it is necessary to make the heights of the protrusions 15 different in order to make the rock angles of the first mass portion 21 and the second mass portion 22 the same. In order to form the protrusions 15 having different heights, the number of processes for forming the protrusions 15 is increased, and the production efficiency is lowered. It is possible to make the two rock angles of the first mass portion 21 and the second mass portion 22 equal using the protrusions 15 having the same height by providing the protrusions 15 in line symmetry with respect to the beam 25. It is possible to efficiently manufacture the physical quantity sensor 100 in which the rock angles between the first mass portion 21 and the second mass portion 22 are made equal by the protrusions 15.

The protrusions 15 are provided at a position corresponding to a center of four openings 26 forming two rows and two columns. In other words, the protrusions 15 are provided at a position that does not coincide with the opening 26. As the protrusion 15 contacts the end portion (edge) of the opening 26, it is possible to suppress breakage of the first and second mass portions 21, 22.

Second Embodiment

Figure 20:
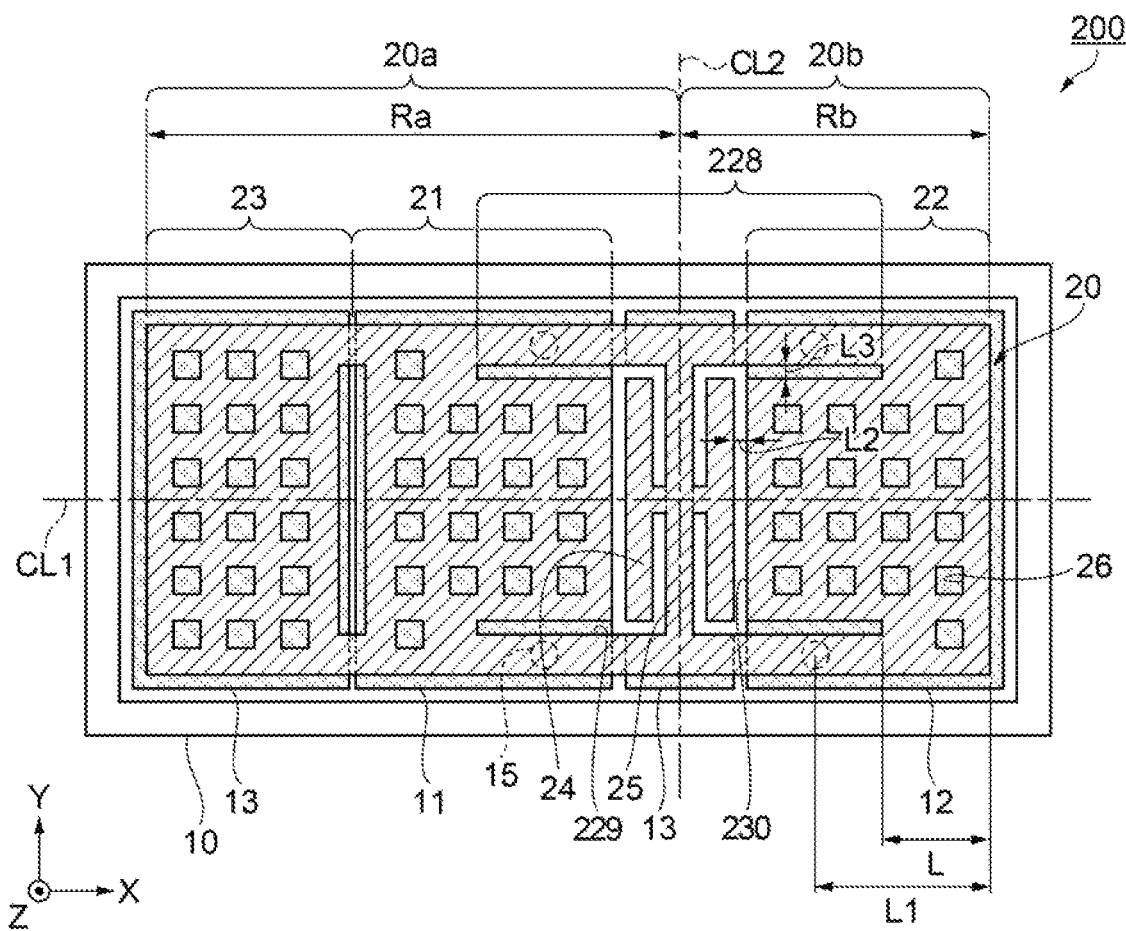
FIG. 20 is a plan view schematically illustrating a physical quantity sensor according to a second embodiment.
Figure 21:
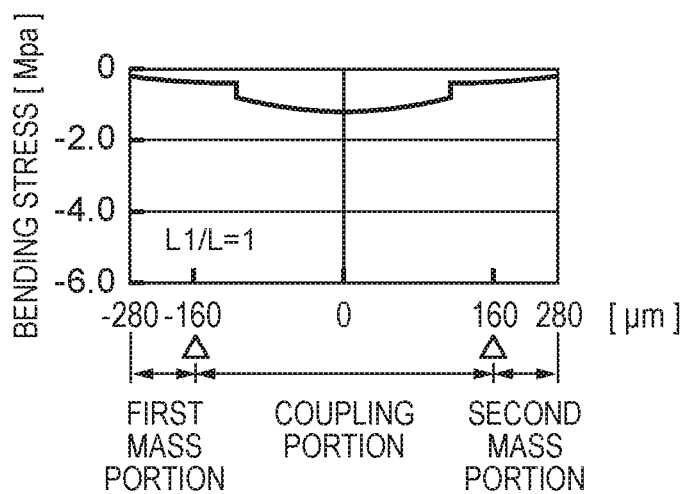
FIG. 21 is a graph illustrating calculation results of the bending stress applied to the movable body.
Figure 22:
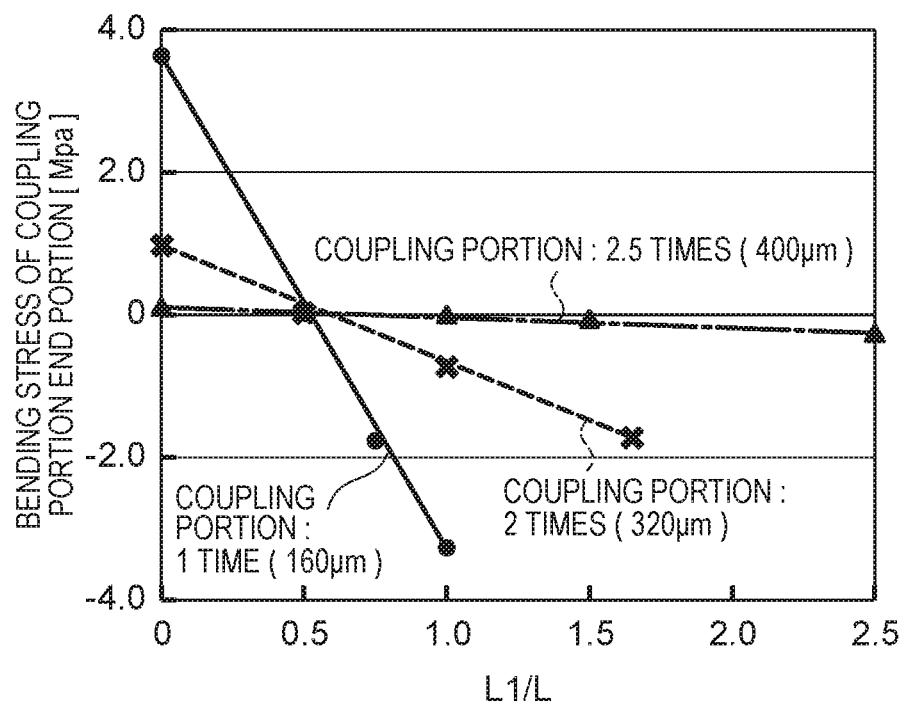
FIG. 22 is a graph illustrating a relationship between positions of a protrusion and bending stress.

FIG. 20 is a plan view schematically illustrating a physical quantity sensor according to a second embodiment. FIG. 21 is a graph illustrating calculation results of the bending stress applied to the movable body. FIG. 22 is a graph illustrating a relationship between positions of a protrusion and bending stress. Hereinafter, a physical quantity sensor 200 according to the second embodiment will be described. The same reference numerals are used for the same constituent parts as those in the first embodiment, and redundant explanations are omitted. In the physical quantity sensor 200 of the present embodiment, the length of the coupling portion 28 in the physical quantity sensor 100 described in the first embodiment is extended.

As illustrated in FIG. 20, the movable body 20 of the physical quantity sensor 200 includes a coupling portion 228. The movable body 20 has slits 229 between the coupling portion 228 and the first mass portion 21 and between the coupling portion 228 and the second mass portion 22. The slits 229 extend from the support portion 24 in the X axis direction. That is, the coupling portion 228 of the present embodiment is extended in both directions in the X axis direction by the slits 229 and the long side of the movable body 20 in the Y axis direction. Specifically, the coupling portion 228 of the physical quantity sensor 200 of the present example is extended to 320 μm which is approximately 2.0 times the length 160 μm of the coupling portion 28 of the physical quantity sensor 100 described in the first embodiment. The protrusions 15 are provided at a position overlapping the coupling portion 228 in the plan view. Even in a case where the coupling portion 228 is extended, it is possible to provide the protrusion 15 at a position near the beam 25. In the present embodiment, the protrusions 15 are provided at a position of L1/L=1.5.

The coupling portion 228 overlaps the first and second fixed electrode 11 and 12 as a measurement electrode in plan view. Specifically, in the coupling portion 228, the region extending in the X axis direction by the slits 229 is a region used as a part of the first mass portion 21 or the second mass portion 22 in the first embodiment and overlaps the first and second fixed electrodes 11 and 12. That is, the extended region of the coupling portion 228 has a function as an electrode (first and second mass portions 21 and 22) that generates electrostatic capacitance between the first and second fixed electrodes 11 and 12, and a function that extends the length connecting the first mass portion 21 and the second mass portion 22. Since the coupling portion 228 overlaps the first and second fixed electrodes 11 and 12, the electrostatic capacitance C1 and C2 generated between the first movable body 20a and the first fixed electrode, and between the second movable body 20b and the second fixed electrode become large and thereby the sensitivity for measuring the acceleration improves.

A width L2 of slits 230 formed between the support portion 24 provided between the beam 25 and the first and second mass portions 21 and 22 and the first and second mass portions 21 and 22 in the X axis direction is 3 μm or less. The first and second mass portions 21 and 22 are divided from the support portion 24 by the slits 230. When rocking (out-of-plane displacement) the first and second mass portions 21 and 22 around the beam 25, there is a case that displacement (in-plane displacement) along the plane of the first and second mass portions 21 and 22 may occur. Since the slits 230 does not disturb in-plane displacement generated when the first and second mass portions 21 and 22 rock (out-of-plane displacement) around the beam 25, accuracy for measuring the acceleration improves. When strong impact is applied in an in-plane direction, the slits 230 becomes a stopper that can reduce excessive in-plane displacement, and since the in-plane displacement of the first and second mass portions 21 and 22 is suppressed to 3 μm or less, it is possible to realize the physical quantity sensor 200 with high reliability.

The slits 230 communicate with the slits 229, and similarly, a width L3 of the slits 229 in the Y axis direction is configured to be 3 μm or less. Since the width of the slits 229 between the coupling portion 228 and the first and second mass portions 21 and 22 is 3 μm or less, in a case where the first and second mass portions 21 and are in-plane displaced 3 μm or more in a direction approaching the coupling portion 228, the first and second mass portions 21 and 22 come into contact with the coupling portion 228 by the displacement, and the in-plane displacement of the first and second mass portions 21 and is suppressed to 3 μm or less. Accordingly, it is possible to prevent the breakage of the first and second mass portions 21 and 22 contacting with the coupling portion 228, and it is possible to realize the physical quantity sensor 200 with high reliability.

Next, the bending stress that the movable body 20 receives when excessive impact is applied to the physical quantity sensor 200 in the vertical direction will be described.

The bending stress calculation results illustrated in FIG. 21 indicates the bending stress generated in each position of a beam model when the coupling portion 28 (228) is 320 μm and the position of the protrusion is L1/L=1 and a load of 4,500 G is applied in the vertical direction in the beam model illustrated in FIG. 3. As is known from the comparison between FIG. 6 and FIG. 21, the absolute value of the bending stress applied to the coupling portion end portions is reduced from 3.3 Mpa to 0.8 Mpa by extending the length of the coupling portion 228. It is possible to further reduce the bending stress applied to the coupling portion end portions by extending the length of the coupling portion 228 by providing the slits 229.

FIG. 22 is a graph that indicates calculations of the bending stress in the case of extending the length of the coupling portion 228 is added to the FIG. 7 described in the first embodiment. The solid line in FIG. 22 indicates when the length of the coupling portion 228 is 160 μm, that is, when the bending stress of the coupling portion 28 is the same as the first embodiment. The broken line indicates the bending stress when the length of the coupling portion 228 is double-extended to 320 μm as the length 160 μm (1.0 times) of the coupling portion 28 of the first embodiment as a reference. The dash-dotted lined indicates the bending stress when the length of the coupling portion 228 is extended to 400 μm of 2.5 times.

As is known from FIG. 22, even in a case where the coupling portion 228 is extended, negative bending stress is generated at the coupling portion end portions in the region where the position of the protrusion 15 is L1/L=0.5 or more. As the length of the coupling portion 228 is extended, the absolute value of the bending stress applied to the coupling portion end portions reduces. In the physical quantity sensor 200 of the present embodiment, the protrusion 15 is provided in a range of L1/L=0.5 or more and L1/L=3.1 or less where the coupling portion 228 is extended by the slits 229 and the movable body 20 convexly bends upward. Breakage occurring at the boundary portion between the coupling portion 228 and the first and second mass portions 21 and 22 can be further suppressed. L1=3.1 L is an upper limit of a position that can be provided with the protrusion 15 when the coupling portion 228 is extended to maximum 2.7 times (approximately 430 μm) in the physical quantity sensor 200 of the present embodiment.

As described above, according to the physical quantity sensor 200 according to the present embodiment, the following effects can be obtained.

The movable body 20 of the physical quantity sensor 200 includes the slits 229 between the coupling portion 228 and the first mass portion 21, and between the coupling portion 228 and the second mass portion 22, and the coupling portion 228 is extended by the slits 229. The protrusion 15 is provided in a range of L1=0.5 L or more and 3.1 L or less. When the coupling portion 228 is extended and the movable body 20 and the protrusion 15 come into contact with each other due to the excessive impact applied to the physical quantity sensor 200 provided in a region where the protrusion 15 is L1=0.5 L or more, the movable body 20 convexly bends opposite to the support substrate 10. As the length of the coupling portion 228 is extended, the absolute value of the bending stress applied to the coupling portion end portions reduces. Breakage generated at the boundary portion between the coupling portion 228 and the first and second mass portions 21 and 22 can be further suppressed.

The protrusion 15 is provided at a position overlapping the coupling portion 228 in the plan view. Even in a case where the coupling portion 228 is extended, it is possible to provide the protrusion 15 at a position near the beam 25.

Since the coupling portion 228 overlaps the first and second fixed electrodes 11 and 12, the electrostatic capacitance C1 and C2 generated between the first movable body 20a and the first fixed electrode, and between the second movable body 20b and the second fixed electrode become large and thereby the sensitivity for measuring the acceleration improves.

The width L2 of the slits 230 formed between the support portion 24 and the first and second mass portions 21 and 22 in the X axis direction is set to 3 μm or less. Since the slits 230 do not disturb in-plane displacement generated when the first and second mass portions 21 and 22 rock (out-of-plane displacement) around the beam 25, accuracy for measuring the acceleration improves. When strong impact is applied in an in-plane direction, the slits 230 become a stopper that can reduce excessive in-plane displacement, and since the in-plane displacement of the first and second mass portions 21 and 22 is suppressed to 3 μm or less, it is possible to realize the physical quantity sensor 200 with high reliability.

Complex Sensor

Figure 23:
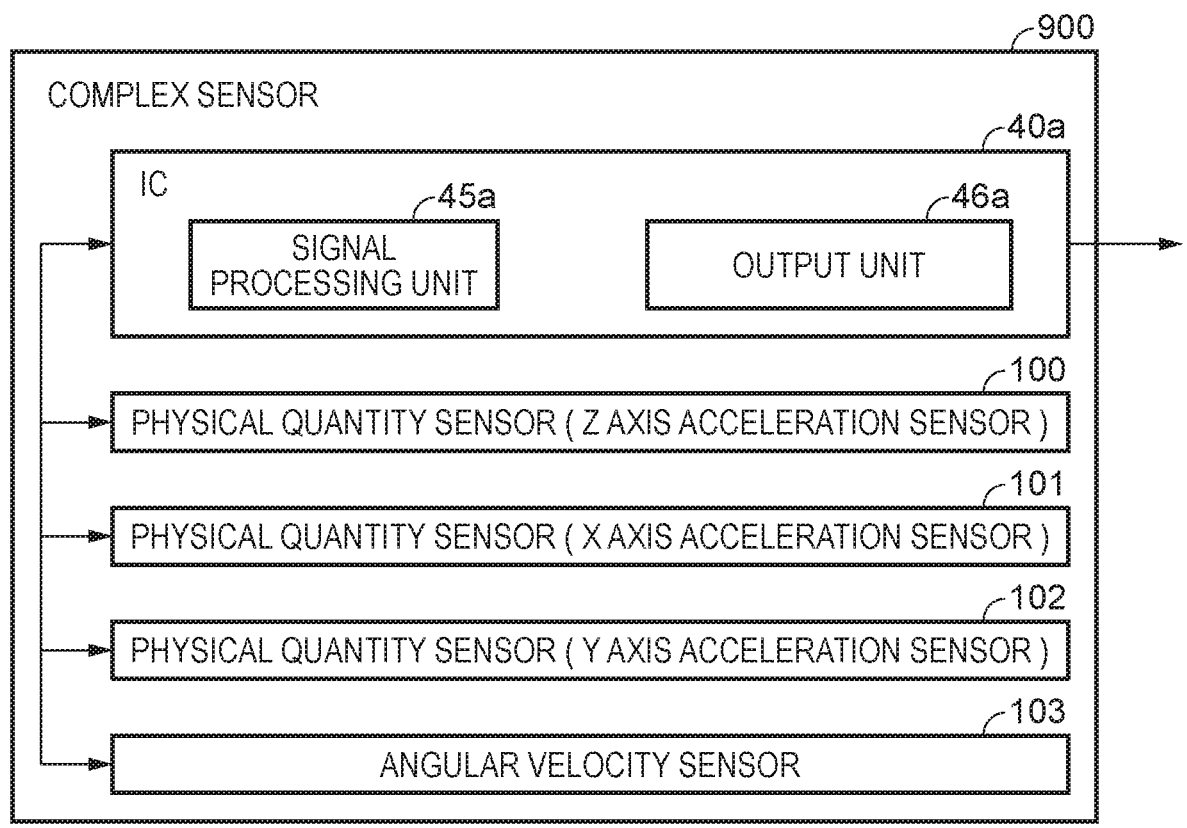
FIG. 23 is a functional block diagram illustrating a schematic configuration of a complex sensor.

Next, a configuration example of a complex sensor including the above-described physical quantity sensor 100 will be described with reference to FIG. 23. FIG. 23 is a functional block diagram illustrating a schematic configuration of a complex sensor.

As illustrated in FIG. 23, a complex sensor 900 includes the physical quantity sensor 100 which is an acceleration sensor for measuring the acceleration in the Z axis direction as described above, a physical quantity sensor 101 which is an acceleration sensor for measuring the acceleration in the X axis direction, a physical quantity sensor 102 which is an acceleration sensor for measuring the acceleration in the Y axis direction, and an angular velocity sensor 103. The angular velocity sensor 103 can efficiently and highly accurately measure the required angular velocity in the one axis direction. The angular velocity sensor 103 can also be provided with three angular velocity sensors 103 corresponding to the respective axial directions in order to measure the angular velocity in three axial directions. Moreover, the complex sensor 900 can include, for example, the IC 40a including, a drive circuit that drives the physical quantity sensors 100, 101, and 102 and the angular velocity sensor 103, a measurement circuit (signal processing unit 45a) for measuring an acceleration and an angular velocity in the X axis, Y axis, and Z axis directions based on and the signal from the physical quantity sensors 100, 101, and 102 and the angular velocity sensor 103, and an output circuit (output unit 46a) that converts a signal from the measurement circuit into a predetermined signal and outputs the signal.

In this manner, the complex sensor 900 can be easily constituted by the physical quantity sensors 100, 101, and 102 and the angular velocity sensor 103, and it is possible to easily obtain a plurality of physical quantity data, for example, acceleration data and angular velocity data by one sensor.

Inertial Measurement Unit

Figure 24:
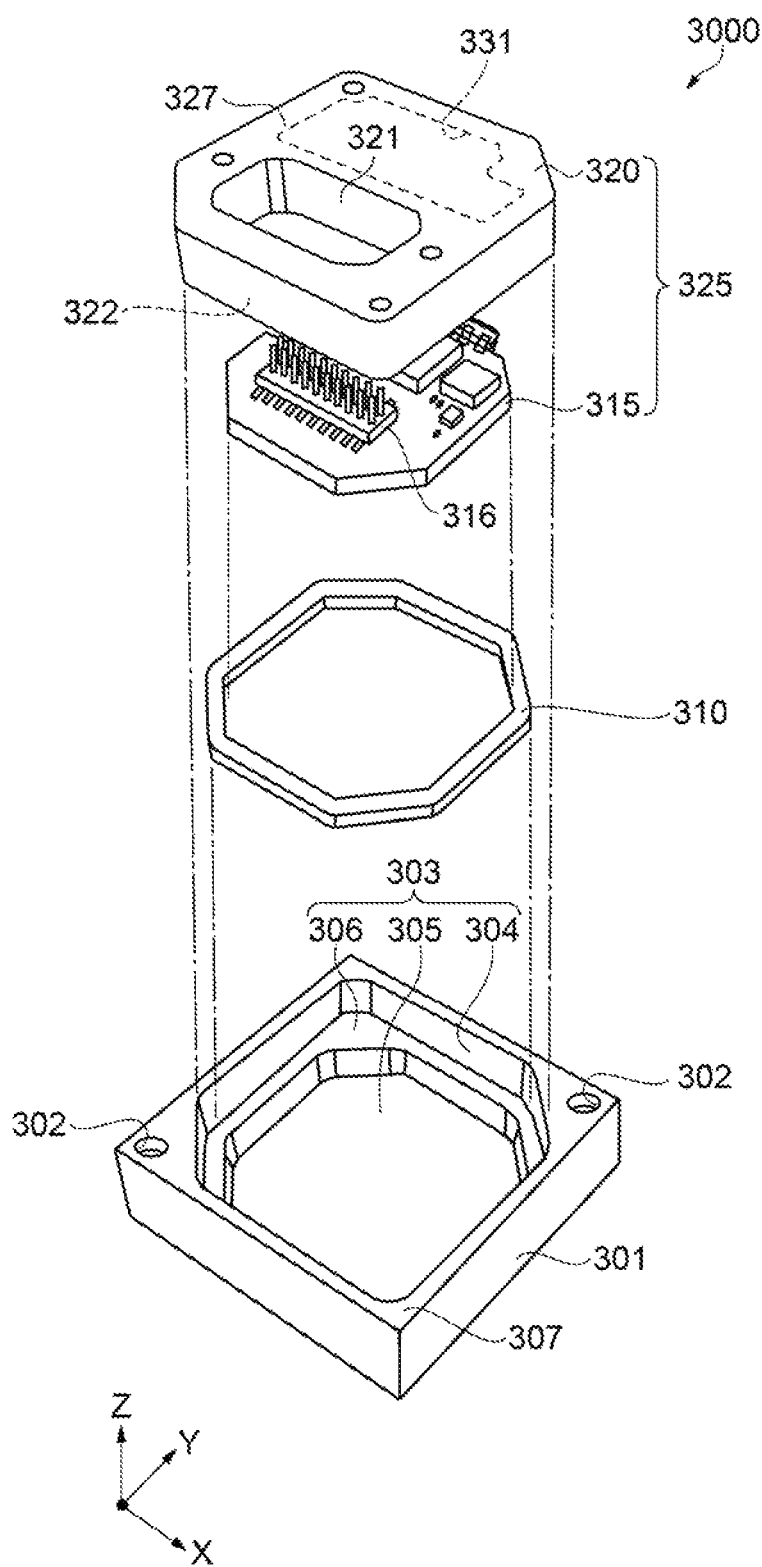
FIG. 24 is a disassembled perspective view illustrating a schematic configuration of an inertial measurement unit.
Figure 25:
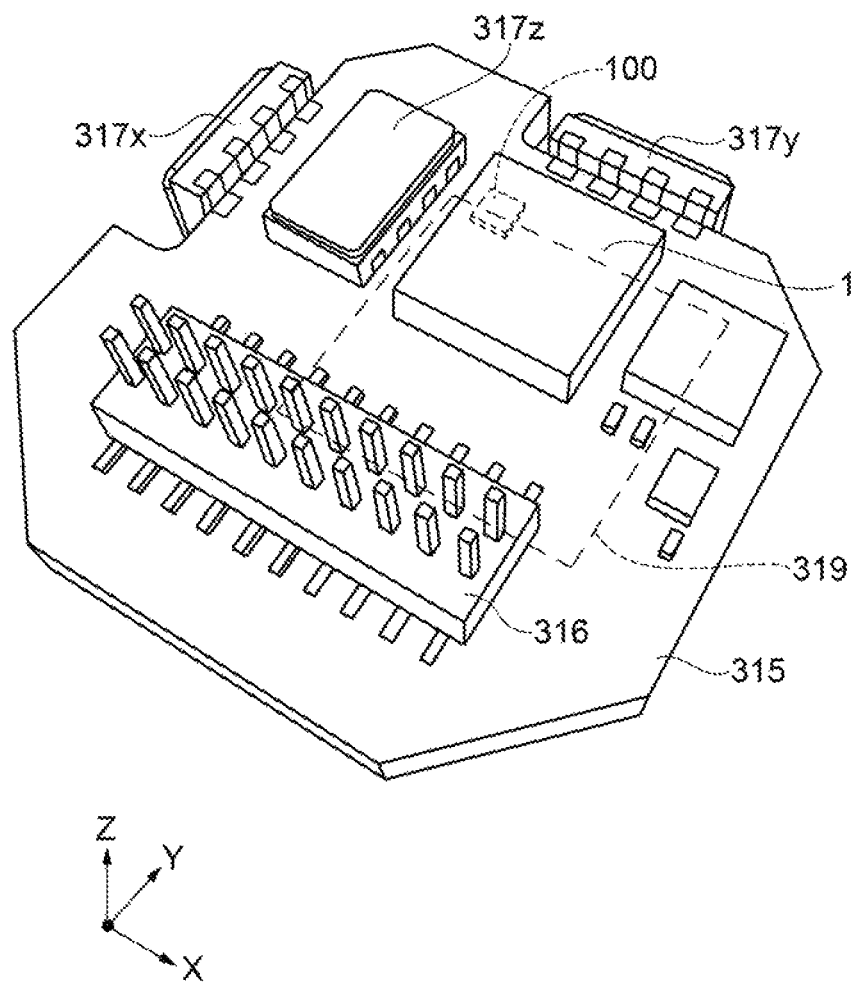
FIG. 25 is a perspective view illustrating a disposal example of inertial sensor elements of the inertial measurement unit.

Next, an inertial measurement unit (IMU) will be described with reference to FIGS. 24 and 25. FIG. 24 is a disassembled perspective view illustrating a schematic configuration of an inertial measurement unit. FIG. 25 is a perspective view illustrating a disposal example of inertial sensor elements of the inertial measurement unit.

As illustrated in FIG. 24, an inertial measurement unit 3000 is configured with a sensor module 325 and the like including an outer case 301, a bonding member 310, and an inertial sensor element. In other words, the sensor module 325 is engaged (inserted) in an inner portion 303 of the outer case 301 with the bonding member 310 interposed therebetween. The sensor module 325 is configured with an inner case 320 and a substrate 315. To make the explanation easier to understand, although the site names are defined as the outer case and the inner case, it may be called the first case and the second case.

The outer case 301 is a pedestal from which aluminum is cut out into a box shape. The material is not limited to aluminum, and other metals such as zinc and stainless steel, resin, or a composite material of metal and resin may be used. The outer shape of the outer case 301 is a rectangular parallelepiped having a substantially square planar shape similar to the overall shape of the above-described inertial measurement unit 3000, and penetration holes (shortcut holes) 302 are formed in the vicinity of two apexes positioned in a diagonal direction of the square, respectively. The invention is not limited to the penetration holes (shortcut holes) 302. For example, a configuration in which a notch (structure in which a notch is formed at a corner portion of the outer case 301 where the penetration holes (shortcut holes) 302 is positioned) that can be screwed by screws is formed and screwed, or a configuration in which a flange (ears) is formed on the side surface of the outer case 301 and the flange portion is screwed may be adopted.

The outer case 301 has a rectangular parallelepiped and a box-like shape without a lid, and the inner portion 303 (inside) thereof is an internal space (container) surrounded by a bottom wall 305 and a side wall 304. In other words, the outer case 301 has a box shape having one surface opposite to the bottom wall 305 as an opening surface, the sensor module 325 is stored so as to cover most of the opening portion of the opening surface (so as to close the opening portion), and the sensor module 325 is exposed from the opening portion (not illustrated). Here, the opening surface opposite to the bottom wall 305 is the same surface as an upper surface 307 of the outer case 301. The planar shape of the inner portion 303 of the outer case 301 is a hexagon obtained by chamfering corners of two apex portions of a square, and the two chamfered apex portions correspond to the positions of the penetration holes (shortcut holes) 302. In the cross-sectional shape (thickness direction) of the inner portion 303, a first bonding surface 306 as a bottom wall one step higher than the central portion is formed on the inner portion 303, that is, the peripheral edge portion of the internal space in the bottom wall 305. That is, the first bonding surface 306 is a part of the bottom wall 305, is a single step-like site portion formed in a ring shape surrounding the central portion of the bottom wall 305 in plan view, and is a surface with a smaller distance from the opening surface (same surface as upper surface 307) than the bottom wall 305.

An example in which the outer shape of the outer case 301 is a rectangular parallelepiped having a substantially square planar shape and a box shape without a lid is described. However, the invention is not limited to this. The planar shape of the outer shape of the outer case 301 may be, for example, a polygon such as a hexagon or an octagon, the corners of the apex portions of the polygon may be chamfered or may be a planar shape in which each side is a curved line. The planar shape of the inner portion 303 (inside) of the outer case 301 is not limited to the above-mentioned hexagon, and it may be a rectangle (tetragon) such as a square or another polygonal shape such as an octagon. The outer shape of the outer case 301 and the planar shape of the inner portion 303 may be similar or may not be similar figures.

The inner case 320 is a member that supports the substrate 315 and has a shape to fit in the inner portion 303 of the outer case 301. Specifically, in a plan view, the shape thereof is a hexagon that the corners of the two apex portions of the square are chamfered, and an opening portion 321 that is a rectangular through-hole and a recess portion 331 that is provided on the surface that supports the substrate 315 are formed therein. The two chamfered apex portions correspond to the positions of the penetration holes (shortcut holes) 302 of the outer case 301. The height in the thickness direction (Z axis direction) is lower than the height from the upper surface 307 of the outer case 301 to the first bonding surface 306. In the preferred example, the inner case 320 is also formed by scraping out aluminum, but other materials may be used like the outer case 301.

Guide pins and supporting surfaces (not illustrated) for positioning the substrate 315 are formed on a rear surface (surface on the side of outer case 301) of the inner case 320. The substrate 315 is set (positioned and installed) on the guide pin and the support surface and adheres to the rear surface of the inner case 320. Details of the substrate 315 will be described later. The peripheral edge portion of the rear surface of the inner case 320 is a second bonding surface 322 formed of a ring-shaped flat surface. The second bonding surface 322 has a planar shape substantially similar to that of the first bonding surface 306 of the outer case 301 in the plan view, and when the inner case 320 is set on the outer case 301, the two surfaces face each other with the bonding member 310 sandwiched therebetween. The configurations of the outer case 301 and the inner case 320 are one example, and the invention is not limited to this structure.

A configuration of the substrate 315 on which an inertial sensor is mounted will be described with reference to FIG. 25. As illustrated in FIG. 25, the substrate 315 is a multilayer substrate having a plurality of through-holes formed therein, and a glass epoxy substrate is used as the substrate 315. It is not limited to a glass epoxy substrate, and any rigid substrate capable of mounting a plurality of inertial sensors, electronic components, connectors and the like may be used. For example, a composite substrate or a ceramic substrate may be used.

On a surface of the substrate 315 (surface on the side of the inner case 320), a connector 316, an angular velocity sensor 317z, and an acceleration measurement unit 1 including the physical quantity sensor 100 as the above-described acceleration sensor for measuring the acceleration in the Z axis direction, and the like are mounted. The connector 316 is a plug type (male) connector, and is provided with two rows of connection terminals disposed at an equal pitch in the X axis direction. Preferably, 20 pins of connection terminals in total (two rows of 10 pins in one row) are used. However, the number of terminals may be appropriately changed according to design specifications.

The angular velocity sensor 317z as an inertial sensor is a gyro sensor that measures angular velocity of one axis in the Z axis direction. As a preferred example, an oscillating gyro sensor which uses crystal as an oscillator and measures an angular velocity from the Coriolis force applied to an oscillating object is used. It is not limited to an oscillating gyro sensor but may be a sensor capable of measuring an angular velocity. For example, a sensor using ceramics or silicon as the oscillator may be used.

On the side surface of the substrate 315 in the X axis direction, an angular velocity sensor 317x for measuring the angular velocity of one axis in the X axis direction is mounted so that the mounting surface (installation surface) is orthogonal to the X axis. Similarly, on the side surface in the Y axis direction of the substrate 315, an angular velocity sensor 317y for measuring the angular velocity of one axis in the Y axis direction is mounted so that the mounting surface (installation surface) is orthogonal to the Y axis.

The angular velocity sensors 317x, 317y, and 317z are not limited to the configuration using three angular velocity sensors for each axis of the X axis, the Y axis, and the Z axis, and any sensor capable of measuring the angular velocities in three axes can be used. For example, a sensor device capable of measuring (detecting) angular velocities of three axes with one device (package) may be used.

The acceleration measurement unit 1 includes at least the physical quantity sensor 100 as the above-described acceleration sensor for measuring the acceleration in the Z axis direction, and it is possible to measure an acceleration of one axis direction (such as Z axis direction), or acceleration of two axis directions (such as Z axis and Y axis, or X axis and Y axis) or three axis directions (X axis, Y axis, Z axis) if necessary.

A control IC 319 as a control unit is mounted on the rear surface (surface on the outer case 301 side) of the substrate 315. The control IC 319 is a micro controller unit (MCU) that incorporates a storage unit including a nonvolatile memory, an A/D converter, and the like, and controls each portion of the inertial measurement unit 3000. The storage unit stores a program that defines the order and contents for measuring an acceleration and an angular velocity, a program that digitizes measurement data and incorporates the measured data into packet data, accompanying data, and the like in the storage unit. A plurality of electronic components are mounted on the substrate 315.

According to such an inertial measurement unit 3000, since the acceleration measurement unit 1 including the physical quantity sensor 100 is used, it is possible to provide the inertial measurement unit 3000 with excellent impact resistance and improved reliability.

Portable Electronic Device

Next, a portable electronic device using the physical quantity sensor 100 will be described based on FIGS. 26 and 27. Hereinafter, a wristwatch type activity meter (active tracker) will be described as an example of a portable electronic device.

Figure 26:
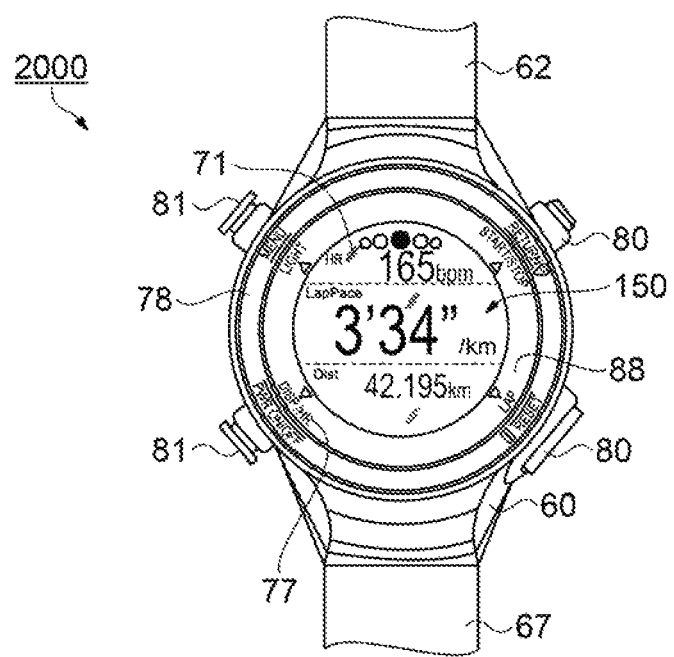
FIG. 26 is a plan view illustrating a schematic configuration of a portable electronic device.
Figure 27:
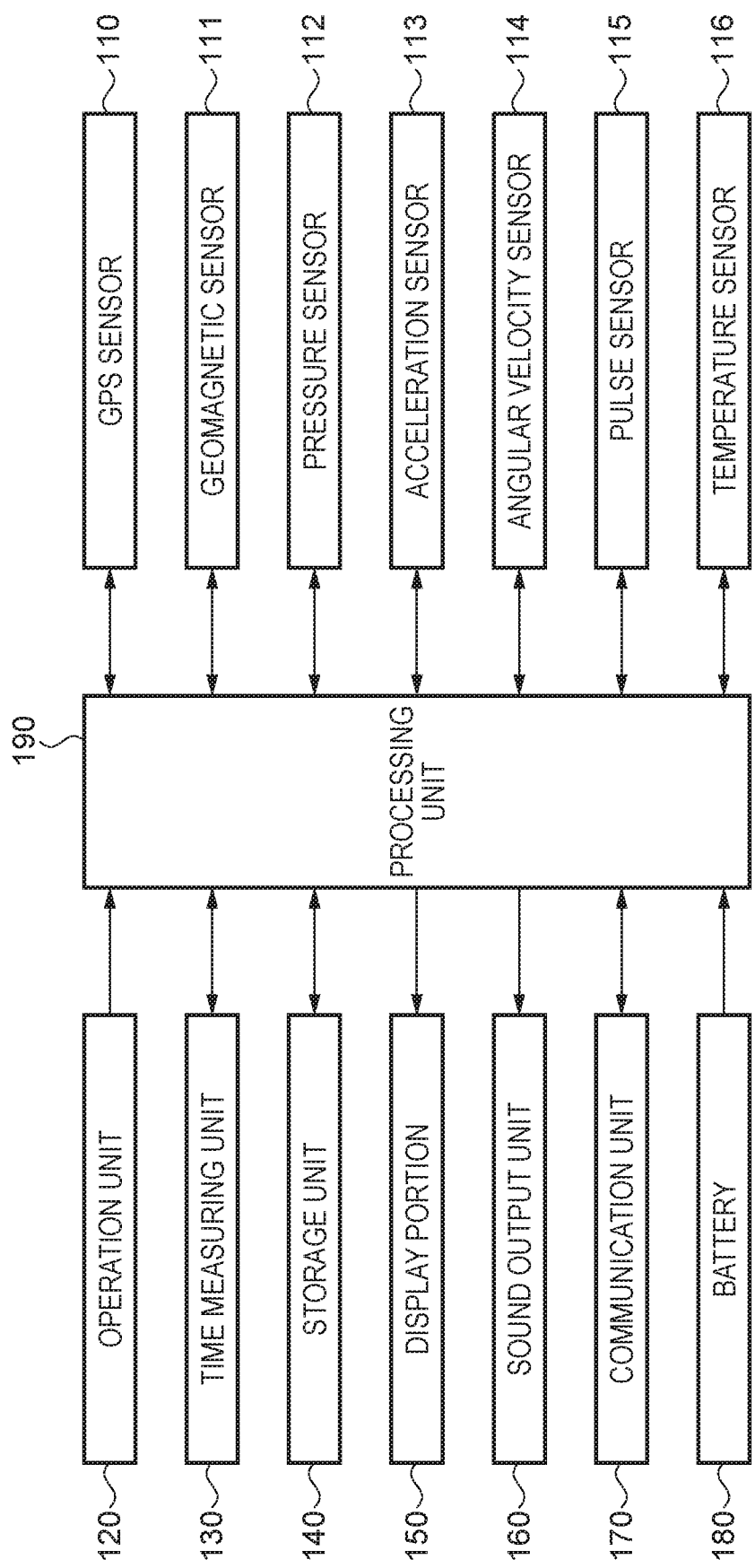
FIG. 27 is a functional block diagram illustrating a schematic configuration of the portable electronic device.

As described in FIG. 26, a wrist device 2000 that is the wristwatch type activity meter (active tracker) is attached to a site (subject) such as a wrist of a user by bands 62 and 67 or the like, has a display portion 150 of digital display and can perform wireless communication. The above-described physical quantity sensor 100 according to the invention is incorporated in the wrist device 2000 as a sensor for measuring an acceleration or a sensor for measuring an angular velocity.

The wrist device 2000 includes at least a case 60 in which the physical quantity sensor 100 is stored, a processing unit 190 (See FIG. 27) that is stored in the case 60, and processes output data from the physical quantity sensor 100, the display portion 150 stored in the case 60, and a light-transmissive cover 71 that covers an opening portion of the case 60. On the outside of the case 60 of the light-transmissive cover 71 of the case 60, a bezel 78 is provided. On the side surface of the case 60, a plurality of operation buttons 80 and 81 are provided. Hereinafter, it will be described in more detail referring also to FIG. 27.

An acceleration sensor 113 including the physical quantity sensor 100 measures each acceleration in three axis directions intersecting (ideally, orthogonal to) each other, and outputs a signal (acceleration signal) corresponding to the magnitude and direction of the measured three-axis acceleration. An angular velocity sensor 114 measures each angular velocity in three axis directions intersecting (ideally, orthogonal to) each other, and outputs a signal (angular velocity signal) corresponding to the magnitude and direction of the measured three-axis angular velocity.

On a liquid crystal display (LCD) constituting the display portion 150, depending on each measurement mode, for example, position information using a GPS sensor 110 or a geomagnetic sensor 111, motion information such as movement amount, exercise amount using the acceleration sensor 113 or the angular velocity sensor 114 included in the physical quantity sensor 100, biometric information such as pulse rate using a pulse sensor 115, time information such as current time, and the like is displayed. It is also possible to display the ambient temperature using a temperature sensor 116.

A communication unit 170 performs various controls for establishing communication between the user terminal and the information terminal (not illustrated). The communication unit 170 includes, for example, Bluetooth (registered trademark) (including BTLE: Bluetooth Low Energy), Wi-Fi (registered trademark) (Wireless Fidelity), Zigbee (registered trademark), near field communication (NFC), and ANT+ (registered trademark) as a transmitter and receiver compatible with the short distance wireless communication standard, and the communication unit 170 is configured to include a connector compatible with a communication bus standard such as a universal serial bus (USB).

The processing unit 190 (processor) is configured by, for example, a micro processing unit (MPU), a digital signal processor (DSP), and an application specific integrated circuit (ASIC). The processing unit 190 executes various processes based on the program stored in a storage unit 140 and the signal input from an operation unit 120 (for example, operation buttons 80 and 81). Processing by the processing unit 190 includes data processing for each output signal of the GPS sensor 110, the geomagnetic sensor 111, a pressure sensor 112, the acceleration sensor 113, the angular velocity sensor 114, the pulse sensor 115, the temperature sensor 116, and a time measuring unit 130, display processing for displaying an image on a display portion 150, a sound output process for outputting a sound to a sound output unit 160, communication processing for communicating with an information terminal (not illustrated) via the communication unit 170, power control processing for supplying power from a battery 180 to each unit, and the like.

In such a wrist device 2000, at least the following functions can be provided.

1. Distance: Measure the total distance from the start of measurement with high accuracy GPS function
2. Pace: Display the current travel pace from the pace distance measurement
3. Average speed: Calculate and display average speed from the average speed running start to the present
4. Height: Measure and display altitude by GPS function
5. Stride: Measure and display the stride even in a tunnel and the like where GPS radio waves do not reach
6. Pitch: Measure and display the number of steps per minute
7. Heart Rate: Measure and display heart rate with pulse sensor
8. Gradient: Measure and display the gradient of the ground in training and trail runs in the mountains
9. Autolap: Automatically perform lap measurement when running for a fixed distance or for a fixed time set in advance
10. Exercise consumption calorie: Display calorie consumption
11. Number of steps: Display the total number of steps from the start of the exercise The wrist device 2000 can be widely applied to a running watch, a runner's watch, a multi-sports compatible runner's watch such as Duathlon and triathlon, an outdoor watch, and a GPS watch in which a satellite positioning system such as GPS is installed, and the like.

A global positioning system (GPS) as a satellite positioning system is described above, and other global navigation satellite systems (GNSS) may be used. For example, any one or more satellite positioning system of European geostationary-satellite navigation overlay service (EGNOS), Quasi Zenith satellite system (QZSS), global navigation satellite system (GLONASS), GALILEO, BeiDou navigation satellite system (BeiDou) may be used. At least one of satellite-based augmentation systems (SBAS) such as a wide area augmentation system (WAAS), a European geostationary-satellite navigation overlay service (EGNOS) may be used for the satellite positioning systems.

Since such a portable electronic device (wrist device 2000) is provided with the physical quantity sensor 100, and the processing unit 190, it has excellent reliability such as impact resistance.

Electronic Device

Next, an electronic device provided with the physical quantity sensor 100 according to the embodiment of the invention will be described with reference to FIG. 28 to FIG. 30.

Figure 28:
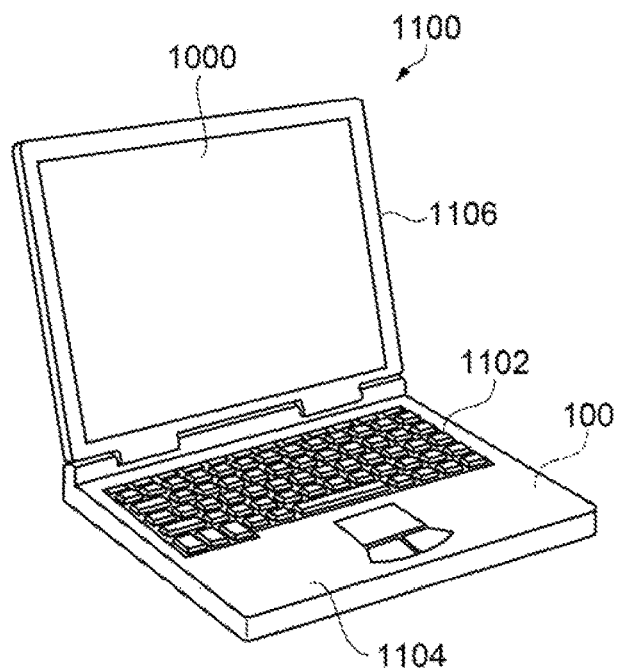
FIG. 28 is a perspective view illustrating a schematic configuration of a mobile type (or notebook type) personal computer as an electronic device that includes the physical quantity sensor.

FIG. 28 is a perspective view illustrating a schematic configuration of a mobile type (or notebook type) personal computer as an electronic device that includes the physical quantity sensor according to the embodiment of the invention. In FIG. 28, a personal computer 1100 is configured with a main body portion 1104 having a keyboard 1102 and a display unit 1106 having a display portion 1000, and the display unit 1106 is rotatably supported relative to the main body portion 1104 via a hinge structure portion. In such a personal computer 1100, the physical quantity sensor 100 functioning as an acceleration sensor is incorporated, and a control unit (not illustrated) can perform control such as attitude control based on the measurement signal from the physical quantity sensor 100.

Figure 29:
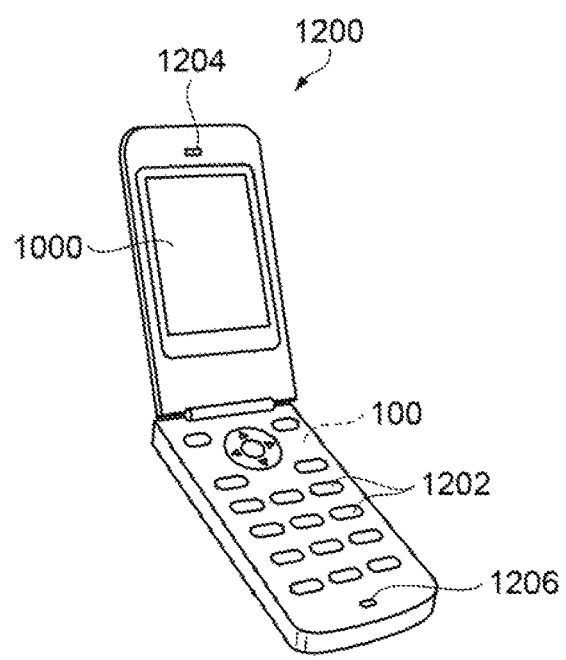
FIG. 29 is a perspective view illustrating a schematic configuration of a mobile phone (including PHS) as an electronic device that includes the physical quantity sensor.

FIG. 29 is a perspective view illustrating a schematic configuration of a mobile phone (including PHS) as an electronic device that includes the physical quantity sensor according to the embodiment of the invention. In FIG. 29, a mobile phone 1200 includes a plurality of operation buttons 1202, an earpiece 1204, and a mouthpiece 1206, and the display portion 1000 is disposed between the operation button 1202 and the earpiece 1204. In such a mobile phone 1200, the physical quantity sensor 100 that functions as an acceleration sensor and the like is incorporated, and a control unit (not illustrated) that can, for example, recognize the attitude and behavior of the mobile phone 1200, change the display image displayed on the display portion 1000, sound an alarm sound or effect sound, or drive the oscillation motor to oscillate the main body based on the measurement signal from the physical quantity sensor 100.

Figure 30:
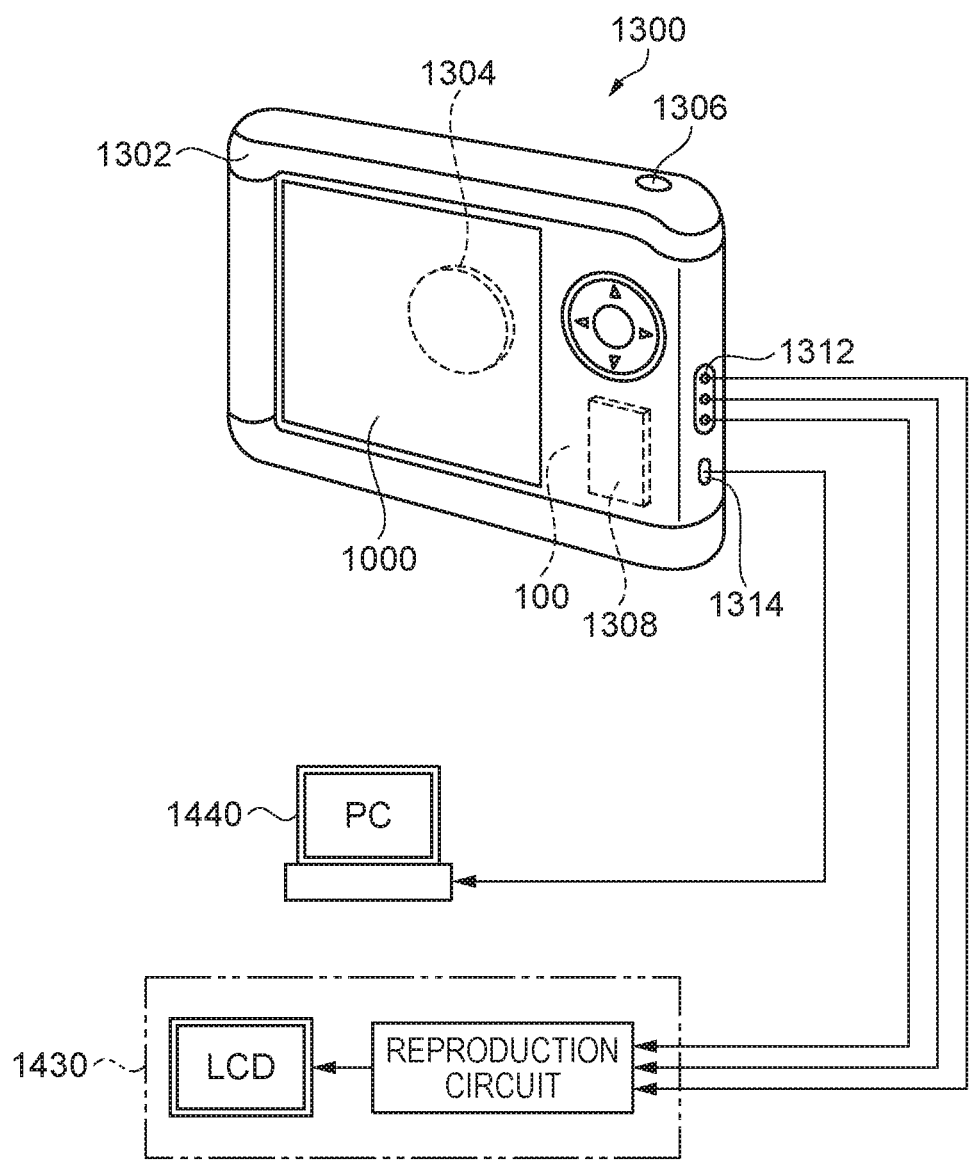
FIG. 30 is a perspective view illustrating a schematic configuration of a digital still camera as an electronic device including the physical quantity sensor.

FIG. 30 is a perspective view illustrating a schematic configuration of a digital still camera as an electronic device including the physical quantity sensor according to the embodiment of the invention. In FIG. 30, connections with external devices are also illustrated briefly. Here, while a film camera in the related art exposes a silver salt photographic film with an optical image of a subject, a digital still camera 1300 photoelectrically converts an optical image of a subject with an image pickup element such as a charge coupled device (CCD) to generate an image pickup signal (image signal).

The display portion 1000 is provided on a back surface of a case (body) 1302 of the digital still camera 1300, and display is performed based on an image pickup signal by the CCD. The display portion 1000 functions as a finder that displays the subject as an electronic image. A light receiving unit 1304 including an optical lens (image pickup optical system) and a CCD or the like is provided on the front side (rear side in the drawing) of the case 1302.

When a photographer checks the subject image displayed on the display portion 1000 and presses a shutter button 1306, the image pickup signal of the CCD at that time is transferred and stored in a memory 1308. The digital still camera 1300 is provided with a video signal output terminal 1312 and an input and output terminal for data communication 1314 on a side surface of the case 1302. As illustrated in FIG. 30, a television monitor 1430 is connected to a video signal output terminal 1312 and a personal computer 1440 is connected to the input and output terminal for data communication 1314, respectively, as required. The image pickup signal stored in the memory 1308 is output to the television monitor 1430 or the personal computer 1440 by a predetermined operation. In such a digital still camera 1300, the physical quantity sensor 100 functioning as an acceleration sensor is incorporated, and a control unit (not illustrated) can perform control such as hand-shake correction based on the measurement signal from the physical quantity sensor 100.

The electronic devices 1100, 1200, and 1300 as described above include the physical quantity sensor 100 capable of improving reliability. Thus, the electronic devices 1100, 1200, and 1300 can have high reliability.

The physical quantity sensor 100 according to the embodiment of the invention can be applied to an electronic device including, for example, an ink jet type discharging device (for example, an ink jet printer), a laptop type personal computer, a television, a video camera, a video tape recorder, a car navigation device, a pager, an electronic notebook (including communication function), an electronic dictionary, a calculator, an electronic game machine, a word processor, a workstation, a video phone, a security monitor for television, an electronic binocular, a POS terminal, a medical device (for example, an electronic thermometer, a blood pressure monitor, a blood glucose meter, an electrocardiogram measurement device, ultrasonic diagnostic equipment, electronic endoscope), a fish finder, various measuring instruments, instruments (for example, instruments of vehicles, aircraft, ships), or a flight simulator, in addition to the personal computer 1100 (mobile type personal computer) in FIG. 28, the mobile phone 1200 in FIG. 29, and the digital still camera 1300 in FIG. 30.

Vehicle

Figure 31:
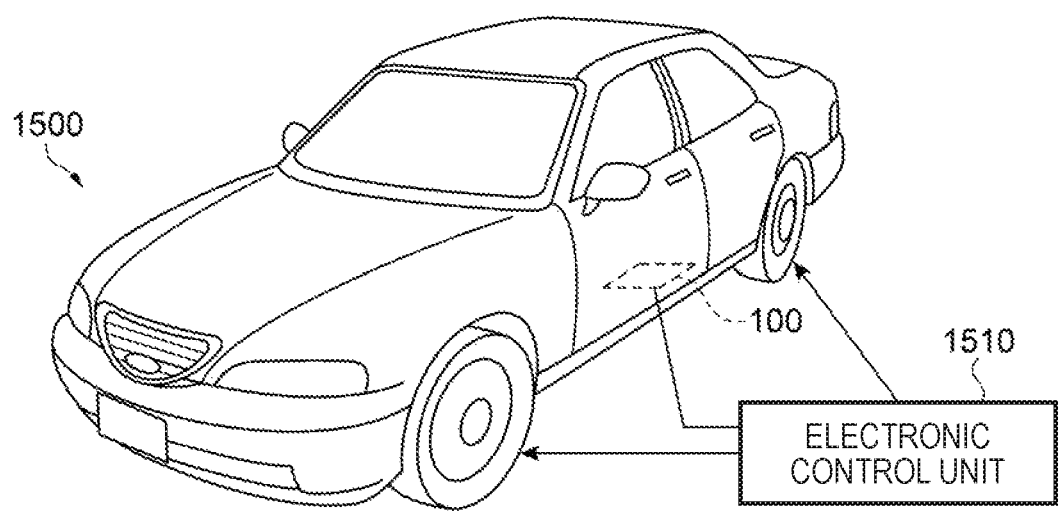
FIG. 31 is a perspective view schematically illustrating an automobile as a vehicle including the physical quantity sensor.

FIG. 31 is a perspective view schematically illustrating an automobile as a vehicle including the physical quantity sensor according to the embodiment of the invention. The physical quantity sensor 100 according to the embodiment is installed on an automobile 1500. For example, as illustrated in FIG. 31, an electronic control unit 1510 that incorporates the physical quantity sensor 100 and controls a tire or the like as a control unit is installed on the vehicle in the automobile 1500 as a vehicle. The physical quantity sensor 100 can also be widely applied to electronic control units (ECU) such as a keyless entry, an immobilizer, a car navigation system, a car air conditioner, an antilock brake system (ABS), an airbag, a tire pressure monitoring system (TPMS), engine control, a battery monitor of a hybrid car or an electric car, and a vehicle attitude control system.

The entire disclosure of Japanese Patent Application No. 2017-165186, filed Aug. 30, 2017 is expressly incorporated by reference herein.

What is claimed is:

1. A physical quantity sensor comprising:
three axes orthogonal to each other being defined as an X axis, a Y axis, and a Z axis;
a support substrate;
first and second measurement electrodes disposed on the support substrate;
first and second protrusions disposed on the support substrate, the first and second protrusions protruding from the support substrate along the Z axis;
a support column disposed on the support substrate, the support column protruding from the support substrate along the Z axis, a height of the support column being larger than a height of the first protrusion and a height of the second protrusion; and
a movable body that is rectangular-plate-shaped on a plane along the X axis and the Y axis, the movable body having a thickness along the Z axis, the movable body having first and second sides opposite to each other along the X axis and third and fourth sides opposite to each other along the Y axis, the movable body being configured with:
a rotation shaft, the rotation shaft extending along the Y axis;
a support fixed on a top of the support column, a part of the support continuously extending from the rotation shaft;
first and second coupling members that are located directly adjacent to the third and fourth sides, respectively, two ends along the Y axis of the rotation shaft being connected to the first and second coupling members, respectively; and
first and second masses located at both sides of the rotation shaft, the first and second masses facing the first and second measurement electrodes, respectively, and facing the first and second protrusions, respectively, first and second outer edges, which are opposite to each other along the X axis, of the first and second masses corresponding to the first and second sides of the movable body,
wherein the first protrusion is configured with a plurality of first protruding structures that are arranged along the Y axis,
wherein a distance along the X axis between the first side of the movable body and a border between the first coupling member and the first mass is L, and a distance along the X axis between the first side of the movable body and one of the plurality of first protruding structures is L1, and
L1 is in a range of 0.5×L to 3.1×L.

2. The physical quantity sensor according to claim 1,
wherein the first and second masses are disposed in line symmetry with respect to the rotation shaft, and
the first and second protrusions are disposed in line symmetry with respect to the rotation shaft.

3. The physical quantity sensor according to claim 1,
wherein the support is provided between the rotation shaft and the first mass, and
wherein a width of a slit formed between the support and the first mass is 3 μm or less.

4. A complex sensor assembly comprising:
the physical quantity sensor according to claim 1, the physical quantity sensor being configured to detect a physical value so as to output a first signal;
an angular velocity sensor configured to detect an angular velocity of one of the X axis, the Y axis, and the Z axis so as to output a second signal; and
an integrated circuit configured to receive the first signal and the second signal and provide an output signal.

5. An inertial measurement unit comprising:
the physical quantity sensor according to claim 1, the physical quantity sensor being configured to detect a physical value so as to output a first signal;
an angular velocity sensor configured to detect an angular velocity of one of the X axis, the Y axis, and the Z axis so as to output a second signal; and
a controller configured to control the physical quantity sensor and the angular velocity sensor.

6. A portable electronic device comprising:
the physical quantity sensor according to claim 1, the physical quantity sensor configured to detect a physical value of the portable electronic device so as to output a detection signal corresponding to the detected physical value of the portable electronic device;
a case in which the physical quantity sensor is housed;
a processor housed in the case and configured to process the detection signal from the physical quantity sensor;
a display housed in the case, the display being configured to display information corresponding to the detection signal; and
a light-transmissive cover that covers an opening portion of the case.

7. An electronic device comprising:
the physical quantity sensor according to claim 1, the physical quantity sensor configured to detect a physical value of the electronic device so as to output a detection signal corresponding to the detected physical value of the electronic device; and
a controller configured to control the electronic device based on the detection signal from the physical quantity sensor.

8. A vehicle comprising:
the physical quantity sensor according to claim 1, the physical quantity sensor configured to detect a physical value of the vehicle so as to output a detection signal corresponding to the detected physical value of the vehicle; and
a controller configured to control the vehicle based on the detection signal from the physical quantity sensor.

9. The physical quantity sensor according to claim 1,
wherein the first mass has a plurality of first through holes arranged in a lattice shape, and the plurality of first through holes penetrate the first mass in the Z axis,
the second mass has a plurality of second through holes arranged in the lattice shape, and the plurality of second through holes penetrate the second mass in the Z axis,
the first protrusion is provided at a position corresponding to a center of adjacent four through holes of the plurality of first through holes when viewed along the Z axis, and
the second protrusion is provided at a position corresponding to a center of adjacent four through holes of the plurality of second through holes when viewed along the Z axis.

10. A complex sensor assembly comprising:
the physical quantity sensor according to claim 9, the physical quantity sensor being configured to detect a physical value so as to output a first signal;
an angular velocity sensor configured to detect an angular velocity of one of the X axis, the Y axis, and the Z axis so as to output a second signal; and
an integrated circuit configured to receive the first signal and the second signal and provide an output signal.

11. The physical quantity sensor according to claim 1,
wherein the movable body has a first slit formed between the first coupling portion member and the first mass, and the first slit extends along the X axis, and
the movable body has a second slit formed between the second coupling member and the first mass, and the second slit extends along the X axis.

12. The physical quantity sensor according to claim 11,
wherein each of the first and second coupling members overlap the first and second measurement electrodes when viewed along the Z axis.

13. The physical quantity sensor according to claim 11,
wherein the first and second protrusions overlap the first and second coupling members when viewed along the Z axis.

14. The physical quantity sensor according to claim 1, wherein the first and second protrusions are provided in line symmetry with respect to the rotation shaft.

15. A complex sensor assembly comprising:
the physical quantity sensor according to claim 14, the physical quantity sensor being configured to detect a physical value so as to output a first signal;
an angular velocity sensor configured to detect an angular velocity of one of the X axis, the Y axis, and the Z axis so as to output a second signal; and
an integrated circuit configured to receive the first signal and the second signal and provide an output signal.

16. An inertial measurement unit comprising:
the physical quantity sensor according to claim 14, the physical quantity sensor being configured to detect a physical value so as to output a first signal;
an angular velocity sensor configured to detect an angular velocity of one of the X axis, the Y axis, and the Z axis so as to output a second signal; and
a controller configured to control the physical quantity sensor and the angular velocity sensor.

17. A portable electronic device comprising:
the physical quantity sensor according to claim 14, the physical quantity sensor configured to detect a physical value of the portable electronic device so as to output a detection signal corresponding to the detected physical value of the portable electronic device;
a case in which the physical quantity sensor is housed;
a processor housed in the case and configured to process the detection signal from the physical quantity sensor;
a display housed in the case, the display being configured to display information corresponding to the detection signal; and
a light-transmissive cover that covers an opening portion of the case.

18. An electronic device comprising:
the physical quantity sensor according to claim 14, the physical quantity sensor configured to detect a physical value of the electronic device so as to output a detection signal corresponding to the detected physical value of the electronic device; and
a controller configured to control the electronic device based on the detection signal from the physical quantity sensor.

19. A vehicle comprising:
   the physical quantity sensor according to claim 14, the physical quantity sensor configured to detect a physical value of the vehicle so as to output a detection signal corresponding to the detected physical value of the vehicle; and
   a controller configured to control the vehicle based on the detection signal from the physical quantity sensor.

* * * * *